(12) United States Patent
Yan et al.

(10) Patent No.: US 11,283,545 B2
(45) Date of Patent: *Mar. 22, 2022

(54) MODULATION METHOD AND APPARATUS

(71) Applicant: HUAWEI TECHNOLOGIES CO., LTD., Shenzhen (CN)

(72) Inventors: Xi Yan, Shenzhen (CN); Huixiao Ma, Shenzhen (CN); Wai Kong Raymond Leung, Shenzhen (CN); Long Luo, Dongguan (CN); Yan Cui, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/887,915

(22) Filed: May 29, 2020

(65) Prior Publication Data
US 2020/0295872 A1    Sep. 17, 2020

Related U.S. Application Data

(63) Continuation of application No. 16/130,293, filed on Sep. 13, 2018, now Pat. No. 10,673,563, which is a
(Continued)

(30) Foreign Application Priority Data

Mar. 14, 2016    (CN) .................. 201610143878.X

(51) Int. Cl.
*H04L 1/00* (2006.01)
*H03M 13/25* (2006.01)
*H03M 7/40* (2006.01)

(52) U.S. Cl.
CPC ............ *H04L 1/0058* (2013.01); *H03M 7/40* (2013.01); *H03M 13/25* (2013.01); *H04L 1/0041* (2013.01); *H04L 1/0071* (2013.01)

(58) Field of Classification Search
CPC ... H04L 1/0058; H04L 1/0041; H04L 1/0071; H03M 13/13; H03M 13/25
See application file for complete search history.

(56) References Cited

U.S. PATENT DOCUMENTS

| 4,559,625 A | 12/1985 | Berlekamp et al. |
| 6,138,265 A | 10/2000 | Morelos-Zaragoza et al. |

(Continued)

FOREIGN PATENT DOCUMENTS

| CN | 101286773 A | 10/2008 |
| CN | 103209053 A | 7/2013 |

(Continued)

OTHER PUBLICATIONS

Charbel Abdel Nour et al, Improving BICM Performance of QAM constellations for broadcasting applications. 2008 5th International Symposium on Turbo Codes and Related Topics, 6 pages.
(Continued)

*Primary Examiner* — Shelly A Chase
(74) *Attorney, Agent, or Firm* — Leydig, Voit & Mayer, Ltd.

(57) ABSTRACT

Embodiments of this application provide a modulation method and apparatus. The method includes: receiving a code word sequence, where each code word includes N bits, and the code word sequence includes at least a first code word; mapping the code word sequence into M sequences, where each sequence includes N/M bits from the first code word; mapping the M sequences into a symbol sequence, where each symbol is corresponding to M bits, the M bits are respectively from the M sequences, first bits corresponding to N/M first-type symbols are from the first code word, and second bits corresponding to N/M second-type symbols are from the first code word. Thus a signal-to-noise ratio requirement during higher order modulation lowered.

24 Claims, 24 Drawing Sheets

Related U.S. Application Data continuation of application No. PCT/CN2017/071926, filed on Jan. 20, 2017.

(56) References Cited

U.S. PATENT DOCUMENTS

| | | | |
|---|---|---|---|
| 7,130,358 B2 | 10/2006 | Kim et al. | |
| 7,356,087 B2 | 4/2008 | Ungerboeck | |
| 7,961,814 B2 | 6/2011 | Golitschek Edler Von Elbwart et al. | |
| 2010/0284491 A1* | 11/2010 | Chen | H04L 27/3488 375/308 |
| 2011/0107174 A1 | 5/2011 | Liu et al. | |
| 2011/0299609 A1 | 12/2011 | Ibi et al. | |
| 2012/0300861 A1 | 11/2012 | Shen et al. | |
| 2015/0071640 A1* | 3/2015 | Batshon | H04J 14/0257 398/91 |
| 2016/0352362 A1* | 12/2016 | Fonseka | H03M 13/036 |
| 2017/0099173 A1 | 4/2017 | Yun et al. | |

FOREIGN PATENT DOCUMENTS

| | | |
|---|---|---|
| CN | 103312456 A | 9/2013 |
| CN | 105376025 A | 3/2016 |
| EP | 1018232 A1 | 7/2000 |
| EP | 3119087 A1 | 1/2017 |
| WO | 9917487 A1 | 4/1999 |
| WO | 2010006469 A1 | 1/2010 |
| WO | 2015149280 A1 | 10/2015 |
| WO | 2015180186 A1 | 12/2015 |

OTHER PUBLICATIONS

Mao-Chao Lin et al, A Coded Modulation Scheme with Interblock Memory. IEEE Transactions on Communications, vol. 42, No. 2/3/4, Feb./Mar./Apr. 1994, 6 pages.

* cited by examiner

| Moment | 1 | 2 | ... | $\frac{n}{3}$ | $\frac{n}{3}+1$ | $\frac{n}{3}+2$ | ... | $\frac{2*n}{3}$ | ... | ... | ... | $3\times\frac{n}{3}$ | ... | ... | ... | $4\times\frac{n}{3}$ | ... |
|---|---|---|---|---|---|---|---|---|---|---|---|---|---|---|---|---|---|
| $D_1$ | X | X | ... | X | $A_1$ | $A_1$ | ... | $A_1$ | ... | $A_2$ | $A_2$ | $A_2$ | ... | $A_3$ | $A_3$ | $A_3$ | ... |
| $D_2$ | $A_1$ | $A_1$ | ... | $A_1$ | $A_2$ | $A_2$ | ... | $A_2$ | ... | $A_3$ | $A_3$ | $A_3$ | ... | $A_4$ | $A_4$ | $A_4$ | ... |
| $D_3$ | $A_1$ | $A_1$ | ... | $A_1$ | $A_2$ | $A_2$ | ... | $A_2$ | ... | $A_3$ | $A_3$ | $A_3$ | ... | $A_4$ | $A_4$ | $A_4$ | ... |

| Moment | $D_1$ | $D_2$ | $D_3$ |
|---|---|---|---|
| ⋮ | ⋮ | ⋮ | ⋮ |
| $4 \times \frac{n}{3}$ | $A_2$ | $A_3$ | $A_4$ |
| ⋮ | ⋮ | ⋮ | ⋮ |
| | $A_2$ | $A_3$ | $A_4$ |
| | $A_2$ | $A_3$ | $A_4$ |
| $3 \times \frac{n}{3}$ | $A_1$ | $A_2$ | $A_3$ |
| ⋮ | ⋮ | ⋮ | ⋮ |
| | $A_1$ | $A_2$ | $A_3$ |
| | $A_1$ | $A_2$ | $A_3$ |
| $\frac{2*n}{3}$ | X | $A_1$ | $A_2$ |
| ⋮ | ⋮ | ⋮ | ⋮ |
| $\frac{n}{3}+2$ | X | $A_1$ | $A_2$ |
| $\frac{n}{3}+1$ | X | $A_1$ | $A_2$ |
| $\frac{n}{3}$ | X | X | $A_1$ |
| ⋮ | ⋮ | ⋮ | ⋮ |
| 2 | X | X | $A_1$ |
| 1 | X | X | $A_1$ |

FIG. 3C

| m=4 | | | | |
|---|---|---|---|---|
| Z | $NUM_1$ | $NUM_2$ | $NUM_3$ | $NUM_4$ |
| 2 | 1 | 3 | | |
| 2 | 2 | 2 | | |
| 3 | 1 | 1 | 2 | |
| 4 | 1 | 1 | 1 | 1 |

FIG. 7A

| m=5 | | | | | |
|---|---|---|---|---|---|
| Z | $NUM_1$ | $NUM_2$ | $NUM_3$ | $NUM_4$ | $NUM_5$ |
| 2 | 1 | 4 | | | |
| 2 | 2 | 3 | | | |
| 3 | 1 | 1 | 3 | | |
| 3 | 1 | 2 | 2 | | |
| 4 | 1 | 1 | 1 | 2 | |
| 5 | 1 | 1 | 1 | 1 | 1 |

FIG. 7B

| m=6 | | | | | | |
|---|---|---|---|---|---|---|
| Z | NUM$_1$ | NUM$_2$ | NUM$_3$ | NUM$_4$ | NUM$_5$ | NUM$_6$ |
| 2 | 1 | 5 | | | | |
| 2 | 2 | 4 | | | | |
| 2 | 3 | 3 | | | | |
| 3 | 1 | 1 | 4 | | | |
| 3 | 1 | 2 | 3 | | | |
| 3 | 2 | 2 | 2 | | | |
| 4 | 1 | 1 | 1 | 3 | | |
| 4 | 1 | 1 | 2 | 2 | | |
| 5 | 1 | 1 | 1 | 1 | 2 | |
| 6 | 1 | 1 | 1 | 1 | 1 | 1 |

FIG. 7C

| m=7 | | | | | | | |
|---|---|---|---|---|---|---|---|
| Z | NUM$_1$ | NUM$_2$ | NUM$_3$ | NUM$_4$ | NUM$_5$ | NUM$_6$ | NUM$_7$ |
| 2 | 1 | 6 | | | | | |
| 2 | 2 | 5 | | | | | |
| 2 | 3 | 4 | | | | | |
| 3 | 1 | 1 | 5 | | | | |
| 3 | 1 | 2 | 4 | | | | |
| 3 | 1 | 3 | 3 | | | | |
| 3 | 2 | 2 | 3 | | | | |
| 4 | 1 | 1 | 1 | 4 | | | |
| 4 | 1 | 1 | 2 | 3 | | | |
| 4 | 1 | 2 | 2 | 2 | | | |
| 5 | 1 | 1 | 1 | 1 | 3 | | |
| 5 | 1 | 1 | 1 | 2 | 2 | | |
| 6 | 1 | 1 | 1 | 1 | 1 | 2 | |
| 7 | 1 | 1 | 1 | 1 | 1 | 1 | 1 |

FIG. 7D

| m=8 | | | | | | | | |
|---|---|---|---|---|---|---|---|---|
| Z | $NUM_1$ | $NUM_2$ | $NUM_3$ | $NUM_4$ | $NUM_5$ | $NUM_6$ | $NUM_7$ | $NUM_8$ |
| 2 | 1 | 7 | | | | | | |
| 2 | 2 | 6 | | | | | | |
| 2 | 3 | 5 | | | | | | |
| 2 | 4 | 4 | | | | | | |
| 3 | 1 | 1 | 6 | | | | | |
| 3 | 1 | 2 | 5 | | | | | |
| 3 | 1 | 3 | 4 | | | | | |
| 3 | 2 | 2 | 4 | | | | | |
| 3 | 2 | 3 | 3 | | | | | |
| 4 | 1 | 1 | 1 | 5 | | | | |
| 4 | 1 | 1 | 2 | 4 | | | | |
| 4 | 1 | 1 | 3 | 3 | | | | |
| 4 | 1 | 2 | 2 | 3 | | | | |
| 4 | 2 | 1 | 2 | 3 | | | | |
| 4 | 2 | 2 | 2 | 2 | | | | |
| 5 | 1 | 1 | 1 | 1 | 4 | | | |
| 5 | 1 | 1 | 1 | 2 | 3 | | | |
| 5 | 1 | 1 | 2 | 2 | 2 | | | |
| 6 | 1 | 1 | 1 | 1 | 1 | 3 | | |
| 6 | 1 | 1 | 1 | 1 | 2 | 2 | | |
| 7 | 1 | 1 | 1 | 1 | 1 | 1 | 2 | |
| 8 | 1 | 1 | 1 | 1 | 1 | 1 | 1 | 1 |

FIG. 7E

| m=9 | | | | | | | | | |
|---|---|---|---|---|---|---|---|---|---|
| Z | $NUM_1$ | $NUM_2$ | $NUM_3$ | $NUM_4$ | $NUM_5$ | $NUM_6$ | $NUM_7$ | $NUM_8$ | $NUM_9$ |
| 2 | 1 | 8 | | | | | | | |
| 2 | 2 | 7 | | | | | | | |
| 2 | 3 | 6 | | | | | | | |
| 2 | 4 | 5 | | | | | | | |
| 3 | 1 | 1 | 7 | | | | | | |
| 3 | 1 | 2 | 6 | | | | | | |
| 3 | 1 | 3 | 5 | | | | | | |
| 3 | 1 | 4 | 4 | | | | | | |
| 3 | 2 | 2 | 5 | | | | | | |
| 3 | 2 | 3 | 4 | | | | | | |
| 3 | 3 | 3 | 3 | | | | | | |
| 4 | 1 | 1 | 1 | 6 | | | | | |
| 4 | 1 | 1 | 2 | 5 | | | | | |
| 4 | 1 | 1 | 3 | 4 | | | | | |
| 4 | 1 | 2 | 2 | 4 | | | | | |
| 4 | 1 | 2 | 3 | 3 | | | | | |
| 4 | 2 | 2 | 2 | 3 | | | | | |
| 5 | 1 | 1 | 1 | 1 | 5 | | | | |
| 5 | 1 | 1 | 1 | 2 | 4 | | | | |
| 5 | 1 | 1 | 1 | 3 | 3 | | | | |
| 5 | 1 | 1 | 2 | 2 | 3 | | | | |
| 5 | 1 | 2 | 2 | 2 | 2 | | | | |
| 6 | 1 | 1 | 1 | 1 | 1 | 4 | | | |
| 6 | 1 | 1 | 1 | 1 | 2 | 3 | | | |
| 6 | 1 | 1 | 1 | 2 | 2 | 2 | | | |
| 7 | 1 | 1 | 1 | 1 | 1 | 1 | 3 | | |
| 7 | 1 | 1 | 1 | 1 | 1 | 2 | 2 | | |
| 8 | 1 | 1 | 1 | 1 | 1 | 1 | 1 | 2 | |
| 9 | 1 | 1 | 1 | 1 | 1 | 1 | 1 | 1 | 1 |

FIG. 7F

| m=10 | | | | | | | | | | |
|---|---|---|---|---|---|---|---|---|---|---|
| Z | NUM$_1$ | NUM$_2$ | NUM$_3$ | NUM$_4$ | NUM$_5$ | NUM$_6$ | NUM$_7$ | NUM$_8$ | NUM$_9$ | NUM$_{10}$ |
| 2 | 1 | 9 | | | | | | | | |
| 2 | 2 | 8 | | | | | | | | |
| 2 | 3 | 7 | | | | | | | | |
| 2 | 4 | 6 | | | | | | | | |
| 2 | 5 | 5 | | | | | | | | |
| 3 | 1 | 1 | 8 | | | | | | | |
| 3 | 1 | 2 | 7 | | | | | | | |
| 3 | 1 | 3 | 6 | | | | | | | |
| 3 | 1 | 4 | 5 | | | | | | | |
| 3 | 2 | 2 | 6 | | | | | | | |
| 3 | 2 | 3 | 5 | | | | | | | |
| 3 | 2 | 4 | 4 | | | | | | | |
| 3 | 3 | 3 | 4 | | | | | | | |
| 4 | 1 | 1 | 1 | 7 | | | | | | |
| 4 | 1 | 1 | 2 | 6 | | | | | | |
| 4 | 1 | 1 | 3 | 5 | | | | | | |
| 4 | 1 | 1 | 4 | 4 | | | | | | |
| 4 | 1 | 2 | 2 | 5 | | | | | | |
| 4 | 1 | 2 | 3 | 4 | | | | | | |
| 4 | 1 | 3 | 3 | 3 | | | | | | |
| 4 | 2 | 2 | 2 | 4 | | | | | | |
| 4 | 2 | 2 | 3 | 3 | | | | | | |
| 5 | 1 | 1 | 1 | 1 | 6 | | | | | |
| 5 | 1 | 1 | 1 | 2 | 5 | | | | | |
| 5 | 1 | 1 | 1 | 3 | 4 | | | | | |
| 5 | 1 | 1 | 2 | 2 | 4 | | | | | |
| 5 | 1 | 1 | 2 | 3 | 3 | | | | | |
| 5 | 1 | 2 | 2 | 2 | 3 | | | | | |
| 5 | 2 | 2 | 2 | 2 | 2 | | | | | |
| 6 | 1 | 1 | 1 | 1 | 1 | 5 | | | | |
| 6 | 1 | 1 | 1 | 1 | 2 | 4 | | | | |
| 6 | 1 | 1 | 1 | 1 | 3 | 3 | | | | |
| 6 | 1 | 1 | 1 | 2 | 2 | 3 | | | | |
| 6 | 1 | 1 | 2 | 2 | 2 | 2 | | | | |
| 7 | 1 | 1 | 1 | 1 | 1 | 1 | 4 | | | |
| 7 | 1 | 1 | 1 | 1 | 1 | 2 | 3 | | | |
| 7 | 1 | 1 | 1 | 1 | 2 | 2 | 2 | | | |
| 8 | 1 | 1 | 1 | 1 | 1 | 1 | 1 | 3 | | |
| 8 | 1 | 1 | 1 | 1 | 1 | 1 | 2 | 2 | | |
| 9 | 1 | 1 | 1 | 1 | 1 | 1 | 1 | 1 | 2 | |
| 10 | 1 | 1 | 1 | 1 | 1 | 1 | 1 | 1 | 1 | 1 |

FIG. 7G

| m=11 | | | | | | | | | | |
|---|---|---|---|---|---|---|---|---|---|---|
| Z | NUM$_1$ | NUM$_2$ | NUM$_3$ | NUM$_4$ | NUM$_5$ | NUM$_6$ | NUM$_7$ | NUM$_8$ | NUM$_9$ | NUM$_{10}$ | NUM$_{11}$ |
| 2 | 1 | 10 | | | | | | | | | |
| 2 | 2 | 9 | | | | | | | | | |
| 2 | 3 | 8 | | | | | | | | | |
| 2 | 4 | 7 | | | | | | | | | |
| 2 | 5 | 6 | | | | | | | | | |
| 3 | 1 | 1 | 9 | | | | | | | | |
| 3 | 1 | 2 | 8 | | | | | | | | |
| 3 | 1 | 3 | 7 | | | | | | | | |
| 3 | 1 | 4 | 6 | | | | | | | | |
| 3 | 1 | 5 | 5 | | | | | | | | |
| 3 | 2 | 2 | 7 | | | | | | | | |
| 3 | 2 | 3 | 6 | | | | | | | | |
| 3 | 2 | 4 | 5 | | | | | | | | |
| 3 | 3 | 3 | 5 | | | | | | | | |
| 3 | 3 | 4 | 4 | | | | | | | | |
| 4 | 1 | 1 | 1 | 8 | | | | | | | |
| 4 | 1 | 1 | 2 | 7 | | | | | | | |
| 4 | 1 | 1 | 3 | 6 | | | | | | | |
| 4 | 1 | 1 | 4 | 5 | | | | | | | |
| 4 | 1 | 2 | 2 | 6 | | | | | | | |
| 4 | 1 | 2 | 3 | 5 | | | | | | | |
| 4 | 1 | 2 | 4 | 4 | | | | | | | |
| 4 | 1 | 3 | 3 | 4 | | | | | | | |
| 4 | 2 | 2 | 2 | 5 | | | | | | | |
| 4 | 2 | 2 | 3 | 4 | | | | | | | |
| 4 | 2 | 3 | 3 | 3 | | | | | | | |
| 5 | 1 | 1 | 1 | 1 | 7 | | | | | | |
| 5 | 1 | 1 | 1 | 2 | 6 | | | | | | |
| 5 | 1 | 1 | 1 | 3 | 5 | | | | | | |
| 5 | 1 | 1 | 1 | 4 | 4 | | | | | | |
| 5 | 1 | 1 | 2 | 2 | 5 | | | | | | |
| 5 | 1 | 1 | 2 | 3 | 4 | | | | | | |
| 5 | 1 | 1 | 3 | 3 | 3 | | | | | | |
| 5 | 1 | 2 | 2 | 2 | 4 | | | | | | |
| 5 | 1 | 2 | 2 | 3 | 3 | | | | | | |
| 5 | 2 | 2 | 2 | 2 | 3 | | | | | | |
| 6 | 1 | 1 | 1 | 1 | 1 | 6 | | | | | |
| 6 | 1 | 1 | 1 | 1 | 2 | 5 | | | | | |
| 6 | 1 | 1 | 1 | 1 | 3 | 4 | | | | | |
| 6 | 1 | 1 | 1 | 2 | 2 | 4 | | | | | |
| 6 | 1 | 1 | 1 | 2 | 3 | 3 | | | | | |
| 6 | 1 | 1 | 2 | 2 | 2 | 3 | | | | | |
| 6 | 1 | 2 | 2 | 2 | 2 | 2 | | | | | |
| 7 | 1 | 1 | 1 | 1 | 1 | 1 | 5 | | | | |
| 7 | 1 | 1 | 1 | 1 | 1 | 2 | 4 | | | | |
| 7 | 1 | 1 | 1 | 1 | 1 | 3 | 3 | | | | |
| 7 | 1 | 1 | 1 | 1 | 2 | 2 | 3 | | | | |
| 7 | 1 | 1 | 1 | 2 | 2 | 2 | 2 | | | | |
| 8 | 1 | 1 | 1 | 1 | 1 | 1 | 1 | 4 | | | |
| 8 | 1 | 1 | 1 | 1 | 1 | 1 | 2 | 3 | | | |
| 8 | 1 | 1 | 1 | 1 | 1 | 2 | 2 | 2 | | | |
| 9 | 1 | 1 | 1 | 1 | 1 | 1 | 1 | 1 | 3 | | |
| 9 | 1 | 1 | 1 | 1 | 1 | 1 | 1 | 2 | 2 | | |
| 10 | 1 | 1 | 1 | 1 | 1 | 1 | 1 | 1 | 1 | 2 | |
| 11 | 1 | 1 | 1 | 1 | 1 | 1 | 1 | 1 | 1 | 1 | 1 |

FIG. 7H

| m=12 | | | | | | | | | | | | |
|---|---|---|---|---|---|---|---|---|---|---|---|---|
| Z | NUM₁ | NUM₂ | NUM₃ | NUM₄ | NUM₅ | NUM₆ | NUM₇ | NUM₈ | NUM₉ | NUM₁₀ | NUM₁₁ | NUM₁₂ |
| 2 | 1 | 11 | | | | | | | | | | |
| 2 | 2 | 10 | | | | | | | | | | |
| 2 | 3 | 9 | | | | | | | | | | |
| 2 | 4 | 8 | | | | | | | | | | |
| 2 | 5 | 7 | | | | | | | | | | |
| 2 | 6 | 6 | | | | | | | | | | |
| 3 | 1 | 1 | 10 | | | | | | | | | |
| 3 | 1 | 2 | 9 | | | | | | | | | |
| 3 | 1 | 3 | 8 | | | | | | | | | |
| 3 | 1 | 4 | 7 | | | | | | | | | |
| 3 | 1 | 5 | 6 | | | | | | | | | |
| 3 | 2 | 2 | 8 | | | | | | | | | |
| 3 | 2 | 3 | 7 | | | | | | | | | |
| 3 | 2 | 4 | 6 | | | | | | | | | |
| 3 | 2 | 5 | 5 | | | | | | | | | |
| 3 | 3 | 3 | 6 | | | | | | | | | |
| 3 | 3 | 4 | 5 | | | | | | | | | |
| 3 | 4 | 4 | 4 | | | | | | | | | |
| 4 | 1 | 1 | 1 | 9 | | | | | | | | |
| 4 | 1 | 1 | 2 | 8 | | | | | | | | |
| 4 | 1 | 1 | 3 | 7 | | | | | | | | |
| 4 | 1 | 1 | 4 | 6 | | | | | | | | |
| 4 | 1 | 1 | 5 | 5 | | | | | | | | |
| 4 | 1 | 2 | 2 | 7 | | | | | | | | |
| 4 | 1 | 2 | 3 | 6 | | | | | | | | |
| 4 | 1 | 2 | 4 | 5 | | | | | | | | |
| 4 | 1 | 3 | 3 | 5 | | | | | | | | |
| 4 | 1 | 3 | 4 | 4 | | | | | | | | |
| 4 | 2 | 2 | 2 | 6 | | | | | | | | |
| 4 | 2 | 2 | 3 | 5 | | | | | | | | |
| 4 | 2 | 2 | 4 | 4 | | | | | | | | |
| 4 | 2 | 3 | 3 | 4 | | | | | | | | |
| 4 | 3 | 3 | 3 | 3 | | | | | | | | |
| 5 | 1 | 1 | 1 | 1 | 8 | | | | | | | |
| 5 | 1 | 1 | 1 | 2 | 7 | | | | | | | |
| 5 | 1 | 1 | 1 | 3 | 6 | | | | | | | |
| 5 | 1 | 1 | 1 | 4 | 5 | | | | | | | |
| 5 | 1 | 1 | 2 | 2 | 6 | | | | | | | |
| 5 | 1 | 1 | 2 | 3 | 5 | | | | | | | |
| 5 | 1 | 1 | 2 | 4 | 4 | | | | | | | |
| 5 | 1 | 1 | 3 | 3 | 4 | | | | | | | |
| 5 | 1 | 2 | 2 | 2 | 5 | | | | | | | |
| 5 | 1 | 2 | 2 | 3 | 4 | | | | | | | |
| 5 | 1 | 2 | 3 | 3 | 3 | | | | | | | |
| 5 | 2 | 2 | 2 | 2 | 4 | | | | | | | |
| 5 | 2 | 2 | 2 | 3 | 3 | | | | | | | |
| 6 | 1 | 1 | 1 | 1 | 1 | 7 | | | | | | |
| 6 | 1 | 1 | 1 | 1 | 2 | 6 | | | | | | |
| 6 | 1 | 1 | 1 | 1 | 3 | 5 | | | | | | |
| 6 | 1 | 1 | 1 | 1 | 4 | 4 | | | | | | |
| 6 | 1 | 1 | 1 | 2 | 2 | 5 | | | | | | |
| 6 | 1 | 1 | 1 | 2 | 3 | 4 | | | | | | |
| 6 | 1 | 1 | 1 | 3 | 3 | 3 | | | | | | |
| 6 | 1 | 1 | 2 | 2 | 2 | 4 | | | | | | |
| 6 | 1 | 1 | 2 | 2 | 3 | 3 | | | | | | |
| 6 | 1 | 2 | 2 | 2 | 2 | 3 | | | | | | |
| 6 | 2 | 2 | 2 | 2 | 2 | 2 | | | | | | |
| 7 | 1 | 1 | 1 | 1 | 1 | 1 | 6 | | | | | |
| 7 | 1 | 1 | 1 | 1 | 1 | 2 | 5 | | | | | |
| 7 | 1 | 1 | 1 | 1 | 1 | 3 | 4 | | | | | |
| 7 | 1 | 1 | 1 | 1 | 2 | 2 | 4 | | | | | |
| 7 | 1 | 1 | 1 | 1 | 2 | 3 | 3 | | | | | |
| 7 | 1 | 1 | 1 | 2 | 2 | 2 | 3 | | | | | |
| 8 | 1 | 1 | 2 | 2 | 2 | 2 | 2 | | | | | |
| 8 | 1 | 1 | 1 | 1 | 1 | 1 | 1 | 5 | | | | |
| 8 | 1 | 1 | 1 | 1 | 1 | 1 | 2 | 4 | | | | |
| 8 | 1 | 1 | 1 | 1 | 1 | 1 | 3 | 3 | | | | |
| 8 | 1 | 1 | 1 | 1 | 1 | 2 | 2 | 3 | | | | |
| 8 | 1 | 1 | 1 | 1 | 2 | 2 | 2 | 2 | | | | |
| 9 | 1 | 1 | 1 | 1 | 1 | 1 | 1 | 1 | 4 | | | |
| 9 | 1 | 1 | 1 | 1 | 1 | 1 | 1 | 2 | 3 | | | |
| 9 | 1 | 1 | 1 | 1 | 1 | 1 | 2 | 2 | 2 | | | |
| 10 | 1 | 1 | 1 | 1 | 1 | 1 | 1 | 1 | 1 | 3 | | |
| 10 | 1 | 1 | 1 | 1 | 1 | 1 | 1 | 1 | 2 | 2 | | |
| 11 | 1 | 1 | 1 | 1 | 1 | 1 | 1 | 1 | 1 | 1 | 2 | |
| 12 | 1 | 1 | 1 | 1 | 1 | 1 | 1 | 1 | 1 | 1 | 1 | 1 |

FIG. 7I

MODULATION METHOD AND APPARATUS

CROSS-REFERENCE TO RELATED APPLICATIONS

This application is a continuation of U.S. patent application Ser. No. 16/130,293, filed on Sep. 13, 2018, which is a continuation of International Application No. PCT/CN2017/071926, filed on Jan. 20, 2017, which claims priority to Chinese Patent Application No. 201610143878.X, filed on Mar. 14, 2016. All of the afore-mentioned patent applications are hereby incorporated by reference in their entireties.

TECHNICAL FIELD

This application relates to the field of communications technologies, and in particular, to a modulation method and apparatus.

BACKGROUND

With development of communications technologies, a transmission rate required by a communications system increases exponentially. Because communication spectrum resources are increasingly scarce, spectrum utilization of a system needs to be fully improved. Manners are studied to improve spectrum efficiency of various communications systems, for example, a microwave backhaul system, a copper wire system, a satellite communication system, a wireless communications system, and a fiber-optic communications system.

Higher order modulation is the first approach used to develop high spectrum efficiency in a communications system. Although the system spectrum efficiency can be greatly improved by using the higher order modulation, the system is required to provide a larger signal-to-noise ratio (SNR). In other words, with a same SNR, a higher modulation order indicates a higher system bit error rate.

SUMMARY

Embodiments of this application disclose a modulation method and apparatus, so as to resolve a problem that a larger signal-to-noise ratio needs to be provided for higher order modulation.

According to a first aspect, an embodiment of this application provides a modulation method, and the method may be implemented by using a modulator on a transmit end. The modulator is configured to modulate a code word into a symbol. The modulator first receives a code word sequence, where each code word includes N bits, and the code word sequence includes at least a first code word; then maps the code word sequence into M sequences, where each sequence includes N/M bits from the first code word; and finally maps the M sequences into a symbol sequence, where each symbol is corresponding to M bits, the M bits are respectively from the M sequences, first bits corresponding to N/M first-type symbols are from the first code word, and second bits corresponding to N/M second-type symbols are from the first code word. Each sequence includes N/M bits from the first code word. Therefore, a first bit corresponding to the second-type symbol is definitely from another code word different from the first code word. Therefore, a bit in the second-type symbol and from the another code word may be demodulated by using information about the first code word, so that the bit in the second-type symbol and from the another code word can be demodulated more accurately, thereby lowering a signal-to-noise ratio requirement during higher order modulation.

In a possible design, the symbol is corresponding to one constellation point in $2^m$ constellation points in a $2^m$ constellation diagram, a minimum Euclidean distance between the constellation points in the $2^m$ constellation diagram is a first Euclidean distance, a minimum Euclidean distance between constellation points that are in the $2^m$ constellation diagram and that may be corresponding to the first-type symbols after bits from the first code word are determined is a second Euclidean distance, and the second Euclidean distance is greater than the first Euclidean distance. The minimum Euclidean distance between the possible constellation points obtained after the bits from the first code word are determined increases. Therefore, demodulation is more accurate, so as to better lower the signal-to-noise ratio requirement during higher order modulation.

In another possible design, the mapping the code word sequence into M sequences may include: performing serial-to-parallel conversion on the code word sequence to obtain the M sequences, where each sequence includes N/M bits from the first code word; and performing delay processing on at least one sequence in the M sequences, where a quantity of delayed bits is X*(N/M), and X is an integer greater than or equal to 1. A solution that is implemented by using a serial-to-parallel converter and a delayer is simple and easy to implement.

In another possible design, the mapping the code word sequence into M sequences includes: interleaving the code word sequence to obtain the M sequences, where each sequence includes N/M bits from the first code word. In a solution that is implemented by using an interleaver, an interleaving rule of the interleaver needs to be designed. A requirement for a designer is relatively high, but system costs may be reduced.

In another possible design, when M is 3, the mapping the code word sequence into M sequences specifically includes: performing serial-to-parallel conversion on the code word sequence to obtain three sequences, where each sequence includes N/3 bits from the first code word; and performing delay processing on a first sequence, where a quantity of delayed bits is N/3.

In another possible design, when M is 3, the mapping the code word sequence into M sequences specifically includes: performing serial-to-parallel conversion on the code word sequence to obtain three sequences, where each sequence includes N/3 bits from the first code word; performing delay processing on a first sequence, where a quantity of delayed bits is N/3; and performing delay processing on a second sequence, where a quantity of delayed bits is N/3.

In another possible design, when M is 3, the mapping the code word sequence into M sequences specifically includes: performing serial-to-parallel conversion on the code word sequence to obtain three sequences, where each sequence includes N/3 bits from the first code word; performing delay processing on a first sequence, where a quantity of delayed bits is 2(N/3); and performing delay processing on a second sequence, where a quantity of delayed bits is N/3.

According to a second aspect, an embodiment of this application provides a receiving method. The receiving method is used by a demodulator on a receive end to receive a symbol sequence generated by using the modulation method provided in the first aspect. The receiving method includes: first, receiving a symbol sequence transmitted by using a channel; demodulating a first-type symbol to obtain a log-likelihood ratio of a bit from a first code word;

demodulating a second-type symbol to obtain a log-likelihood ratio of a bit from the first code word; performing decoding based on log-likelihood ratios of $a_{11}$ bits from the first code word to obtain first extrinsic information; and demodulating the second-type symbol by using the first extrinsic information to obtain a log-likelihood ratio of a bit from another code word. The second-type symbol may be demodulated by using first extrinsic information related to the first code word, so that a bit in the second-type symbol and from another code word can be demodulated more accurately.

In a possible design, the first-type symbol further includes a bit from a second code word, and before the demodulating a first-type symbol to obtain a log-likelihood ratio of a bit from a first code word, the method further includes: performing decoding based on log-likelihood ratios of all bits from the second code word to obtain second extrinsic information; and the demodulating a first-type symbol to obtain a log-likelihood ratio of a bit from a first code word includes: demodulating the first-type symbol by using the second extrinsic information to obtain the log-likelihood ratio of the bit from first code word.

In a possible design, the first extrinsic information is information obtained after prior information of the decoding is subtracted from posterior information that is obtained after the decoding; or the first extrinsic information is posterior information that is obtained after the decoding.

According to a third aspect, an embodiment of this application provides a modulation apparatus such as a modulator. The modulation apparatus includes: a first mapper, configured to: receive a code word sequence, where each code word includes N bits, and the code word sequence includes at least a first code word; and map the code word sequence into M sequences, where each sequence includes N/M bits from the first code word; and a second mapper, configured to map the M sequences into a symbol sequence, where each symbol is corresponding to M bits, the M bits are respectively from the M sequences, first bits corresponding to N/M first-type symbols are from the first code word, and second bits corresponding to N/M second-type symbols are from the first code word.

In a possible design, the symbol is corresponding to one constellation point in $2^m$ constellation points in a $2^m$ constellation diagram, a minimum Euclidean distance between the constellation points in the $2^m$ constellation diagram is a first Euclidean distance, a minimum Euclidean distance between constellation points that are in the $2^m$ constellation diagram and that may be corresponding to the first-type symbols after bits from the first code word are determined is a second Euclidean distance, and the second Euclidean distance is greater than the first Euclidean distance.

In a possible design, the first mapper includes a serial-to-parallel converter and a delayer, where the serial-to-parallel converter is configured to: receive a code word sequence, where each code word includes N bits, and the code word sequence includes at least a first code word; and perform serial-to-parallel conversion on the code word sequence to obtain M sequences, where each sequence includes N/M bits from the first code word; and the delayer is configured to perform delay processing on at least one sequence in the M sequences, where a quantity of delayed bits is X*(N/M), and X is an integer greater than or equal to 1.

In a possible design, the first mapper includes an interleaver, where the interleaver is configured to: receive a code word sequence, where each code word includes N bits, and the code word sequence includes at least a first code word; and interleave the code word sequence to obtain M sequences, where each sequence includes N/M bits from the first code word.

In a possible design, the first mapper includes a serial-to-parallel converter and a delayer, where the serial-to-parallel converter is configured to: receive a code word sequence, where each code word includes N bits, and the code word sequence includes at least a first code word; and perform serial-to-parallel conversion on the code word sequence to obtain three sequences, where each sequence includes N/3 bits from the first code word; and the delayer is configured to perform delay processing on a first sequence, where a quantity of delayed bits is N/3.

In a possible design, the first mapper includes a serial-to-parallel converter and a delayer, where the serial-to-parallel converter is configured to: receive a code word sequence, where each code word includes N bits, and the code word sequence includes at least a first code word; and perform serial-to-parallel conversion on the code word sequence to obtain three sequences, where each sequence includes N/3 bits from the first code word; and the delayer is configured to: perform delay processing on a first sequence, where a quantity of delayed bits is N/3; and perform delay processing on a second sequence, where a quantity of delayed bits is N/3.

In a possible design, the first mapper includes a serial-to-parallel converter and a delayer, where the serial-to-parallel converter is configured to: receive a code word sequence, where each code word includes N bits, and the code word sequence includes at least a first code word; and perform serial-to-parallel conversion on the code word sequence to obtain three sequences, where each sequence includes N/3 bits from the first code word; and the delayer is configured to: perform delay processing on a first sequence, where a quantity of delayed bits is 2(N/3); and perform delay processing on a second sequence, where a quantity of delayed bits is N/3.

According to a fourth aspect, an embodiment of this application provides a receiving apparatus, including: a demodulator, configured to receive a symbol sequence transmitted by using a channel, where the symbol sequence is a symbol sequence generated in any one of claims 11 to 17; demodulate a first-type symbol to obtain a log-likelihood ratio of a bit from a first code word; and demodulate a second-type symbol to obtain a log-likelihood ratio of a bit from the first code word; and a decoder, configured to perform decoding based on log-likelihood ratios of $a_{11}$ bits from the first code word to obtain first extrinsic information; where, in addition to receiving the symbol sequence transmitted by using the channel, the demodulator is further configured to demodulate the second-type symbol by using the first extrinsic information to obtain a log-likelihood ratio of a bit from another code word.

In a possible design, the first-type symbol further includes a bit from a second code word; the decoder is further configured to perform decoding based on log-likelihood ratios of $a_{11}$ bits from the second code word to obtain second extrinsic information; and that the demodulator is configured to demodulate the first-type symbol to obtain the log-likelihood ratio of the bit from the first code word includes: the demodulator is configured to demodulate the first-type symbol by using the second extrinsic information to obtain the log-likelihood ratio of the bit from first code word.

In a possible design, the first extrinsic information is information obtained after prior information of the decoding is subtracted from posterior information that is obtained after the decoding; or the first extrinsic information is posterior information that is obtained after the decoding.

In the modulation method provided in the embodiments of this application, each sequence in the M sequences includes the N/M bits from the first code word, the first bits corresponding to the N/M first-type symbols in the symbol sequence are from the first code word, and the second bits corresponding to the N/M second-type symbols in the symbol sequence are from the first code word. As a result, a first bit corresponding to the second-type symbol is definitely from another code word different from the first code word. Therefore, a bit in the second-type symbol and from the another code word may be demodulated by using information about the first code word, so that the bit in the second-type symbol and from the another code word can be demodulated more accurately, thereby lowering a signal-to-noise ratio requirement during higher order modulation.

BRIEF DESCRIPTION OF DRAWINGS

FIG. 3A is a schematic diagram of an input bit stream of a mapper according to an embodiment of this application;

FIG. 3B is a schematic diagram of an input bit stream of another mapper according to an embodiment of this application;

FIG. 3C is a schematic diagram of an input bit stream of still another mapper according to an embodiment of this application;

FIG. 7A is a schematic diagram of parameter configuration of $NUM_i$ when m=4 according to an embodiment of this application;

FIG. 7B is a schematic diagram of parameter configuration of $NUM_i$ when m=5 according to an embodiment of this application;

FIG. 7C is a schematic diagram of parameter configuration of $NUM_i$ when m=6 according to an embodiment of this application;

FIG. 7D is a schematic diagram of parameter configuration of $NUM_i$ when m=7 according to an embodiment of this application;

FIG. 7E is a schematic diagram of parameter configuration of $NUM_i$ when m=8 according to an embodiment of this application;

FIG. 7F is a schematic diagram of parameter configuration of $NUM_i$ when m=9 according to an embodiment of this application;

FIG. 7G is a schematic diagram of parameter configuration of $NUM_i$ when m=10 according to an embodiment of this application;

FIG. 7H is a schematic diagram of parameter configuration of $NUM_i$ when m=11 according to an embodiment of this application; and FIG. 7I is a schematic diagram of parameter configuration of $NUM_i$ when m=12 according to an embodiment of this application.

DESCRIPTION OF EMBODIMENTS

The following describes the technical solutions in the embodiments of this application with reference to the accompanying drawings in the embodiments of this application.

Figure 1A:
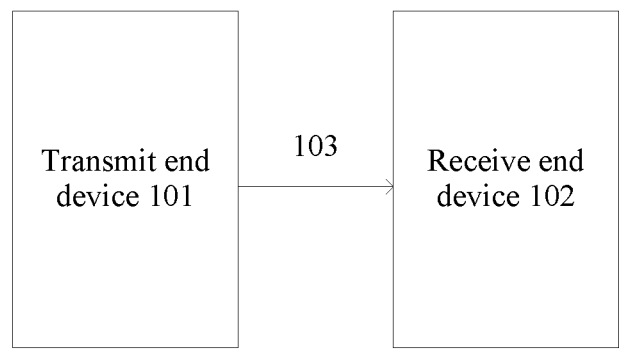
FIG. 1A is a structural diagram of an information sending network according to an embodiment of this application.

The embodiments of this application have wide application scenarios, for example, a microwave backhaul system, a copper wire system, a satellite communication system, a wireless communications system, and a fiber-optic communications system. The embodiments of this application are mainly applied to information transmission between devices. FIG. 1A is a structural diagram of a typical information sending network. The network includes a transmit end device 101 and a receive end device 102. A link 103 between the transmit end device 101 and the receive end device 102 may be a microwave link, a copper link, a satellite link, a wireless communications link, a fiber link, and the like. The transmit end device 101 sends a signal to the receive end device 102. Before sending the signal, the transmit end device 101 needs to perform processing such as coding and modulation on a to-be-sent information bit.

For ease of the following description, several concepts are first described.

Information bit stream: $U=\{\{u_{1,1}, u_{1,2}, \ldots, u_{1,k}\}, \{u_{2,1}, u_{2,2}, \ldots, u_{2,k}\}, \{u_{3,1}, u_{3,2}, \ldots, u_{3,k}\}, \ldots\}$, where $\{u_{1,i}, u_{1,2}, \ldots, u_{1,k}\}$ is an information sequence.

Coding: Coding in the embodiments of this application is channel coding, and is essentially to improve communication reliability and reduce a bit error rate of transmission. A channel coding process includes inserting some redundant bits into a source data bit stream with a specific length, so as to check and correct an error in source data bits at a receive end by using a relationship between the redundant bits and the source data bits, thereby achieving an objective of error correction. Generally, the source data bit is referred to as an information bit, and the redundant bit is referred to as a check bit. For example, the information bit stream $U=\{\{u_{1,1}, u_{1,2}, \ldots, u_{1,k}\}, \{u_{2,1}, u_{2,2}, \ldots, u_{2,k}\}, \{u_{3,1}, u_{3,2}, \ldots, u_{3,k}\}, \ldots\}$ enters a coder, and every k bits form one information sequence denoted as $U_i$. Each information sequence is coded by using a same coding rule, and p check bits are added into each information sub-sequence to form a code word whose length is n. A coded bit stream $Q=\{\{q_{1,1}, q_{1,2}, \ldots, q_{1,n}\}, \{q_{2,1}, q_{2,2}, \ldots, q_{2,n}\}, \{q_{3,1}, q_{3,2}, \ldots, q_{3,n}\}, \ldots\}$ is output, where $\{q_{i,1}, q_{i,2}, \ldots, q_{i,n}\}$ is referred to as one code word and denoted as $Q_i$.

Code word: After coding processing, a code word such as the code word $Q_i=\{q_{i,1}, q_{i,2}, \ldots, q_{i,n}\}$ mentioned above may be obtained. A length of $Q_i$ is n, that is, $Q_i$ includes n bits, and the n bits meet a check relationship. In some scenarios, these code words may be processed to obtain a new code word. For example, a new code word is generated by shortening or puncturing the n bits that meet the check relationship; a new cord word is generated by padding a known bit into the n bits that meet the check relationship; a new code word is obtained by combining a plurality of code words; and a new code word is obtained by interleaving the n bits that meet the check relationship.

Figure 1B:
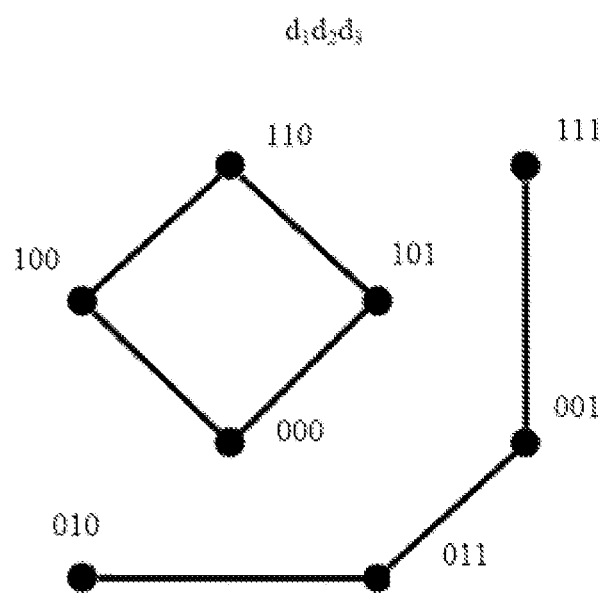
FIG. 1B is a constellation diagram according to an embodiment of this application.

Modulation: A $2^m$QAM modulator maps m input bit streams into one symbol stream. In a $2^m$QAM modulation scheme, there are in total $2^m$ modulation symbols $\{s^1, s^2, \ldots, s^{2^m}\}$ corresponding to $2^m$ complex number constellation points in a modulation constellation diagram. Each complex number constellation point includes an I component and a Q component, and each modulation symbol $s^j$ is mapped from m bits $(b_1, b_2, \ldots b_m)$. For example, for an 8QAM modulator, there are in total eight constellation points in a constellation diagram, which are corresponding to eight modulation symbols. As shown in an 8QAM constellation diagram in FIG. 1B, each symbol is mapped from three bits, and a mapping relationship between bits and symbols is shown in Table 1. A plurality of solutions may be used to modulate a symbol onto a carrier. For example, amplitude modulation may be performed on an I component and a Q component of each symbol, and the I component and the Q component are correspondingly modulated on two mutually orthogonal carriers respectively for sending. The carriers herein may be electrical carriers, optical carriers, and the like.

TABLE 1

Mapping relationship between symbols and bits in 8 QAM

| Bits | I | Q |
| --- | --- | --- |
| 000 | −1 | −1 |
| 001 | 3 | −1 |
| 011 | 1 | −3 |
| 010 | −3 | −3 |
| 110 | −1 | 3 |
| 111 | 3 | 3 |
| 101 | 1 | 1 |
| 100 | −3 | 1 |

A to-be-modulated code word sequence is processed in the embodiments of this application, so that a specific correspondence exists between a modulation symbol and a to-be-modulated code word. Specifically, each code word in the to-be-modulated code word sequence includes N bits, and the to-be-modulated code word sequence includes at least a first code word. The code word sequence is mapped into M sequences, where each sequence includes N/M bits from the first code word. The M sequences are mapped into a symbol sequence, where each symbol is corresponding to M bits, the M bits are respectively from the M sequences, first bits corresponding to N/M first-type symbols are from the first code word, and second bits corresponding to N/M second-type symbols are from the first code word.

To compensate for an SNR cost brought by higher order modulation, this application provides a method for coding and mapping a modulated bit, so that bits mapped into a same higher order modulation symbol are from two or more code words. In this way, during demodulation, more accurate information is obtained after decoding is completed by using a bit from a previous code word, so as to help demodulate a bit from a second code word. The second code word is decoded by using a demodulated bit from the second code word to obtain accurate information, so as to help demodulate a bit from a third code word. By analogy, demodulation of $a_{11}$ bits is completed.

The following uses 8QAM modulation as an example for description. There are in total eight constellation points in an 8QAM constellation diagram, which are corresponding to eight modulation symbols. Each modulation symbol is mapped from three bits.

Figure 2A:
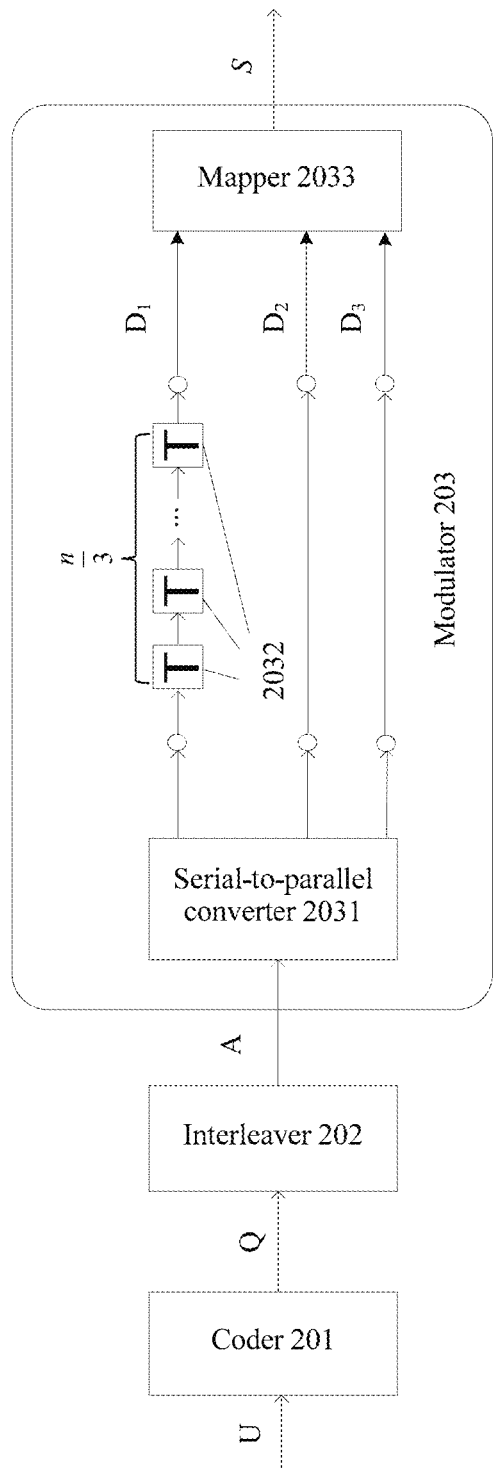
FIG. 2A is a structural diagram of a transmit end device according to an embodiment of this application.

As shown in FIG. 2A, FIG. 2A is a structural diagram of a transmit end device according to an embodiment of this application. The transmit end device includes: a coder 201, an interleaver 202, and a modulator 203.

The coder 201 is configured to implement the coding function mentioned above. For example, the information bit stream $U=\{\{u_{1,1}, u_{1,2}, \ldots, u_{1,k}\}, \{u_{2,1}, u_{2,2}, \ldots, u_{2,k}\}, \{u_{3,1}, u_{3,2}, \ldots, u_{3,k}\}, \ldots\}$ enters the coder, and every k bits form one information sequence denoted as $U_i$. Each information sequence is coded by using a same coding rule, and p check bits are added into each information sub-sequence to form a code word whose length is n. A coded bit stream $Q=\{\{q_{1,1}, q_{1,2}, \ldots, q_{1,n}\}, \{q_{2,1}, q_{2,2}, \ldots, q_{2,n}\}, \{q_{3,1}, q_{3,2}, \ldots, q_{3,n}\}, \ldots\}$ is output, where $\{q_{i,1}, q_{i,2}, \ldots, q_{i,n}\}$ is referred to as one code word and denoted as $Q_i$.

The interleaver 202 may perform bit-level interleaving processing on the coded bit stream output by the coder 201, and output an interleaved coded bit stream that may be denoted, for example, as $A=\{\{A_{1,1}, A_{1,2}, \ldots, A_{1,n}\}, \{A_{2,1}, A_{2,2}, \ldots, A_{2,n}\}, \{A_{3,1}, A_{3,2}, \ldots, A_{3,n}\}, \ldots\}$. $A_i=\{A_{i,1}, A_{i,2}, \ldots, A_{i,n}\}$ is denoted as one interleaved code word. Certainly, a length of the interleaved code word may be different from a length of the code word before the interleaving. In this embodiment of this application, the interleaver 202 is optional, and the coded bit stream output by the coder 201 may be directly sent to the modulator 203.

The modulator 203 includes a serial-to-parallel converter 2031, a delayer 2032, and a mapper 2033.

The serial-to-parallel converter 2031 performs serial-to-parallel convention on the interleaved coded bit stream to convert the interleaved coded bit stream into three sequences, where each code word $A_i=\{A_{i,1}, A_{i,2}, \ldots, A_{i,n}\}$ is equally divided into three parts. If the code word $A_i=\{A_{i,1}, A_{i,2}, \ldots, A_{i,n}\}$ cannot be equally divided, the code word may be processed before serial-to-parallel conversion to obtain a new code word, and the new code word can be equally divided into three parts. For example, the new code word may be generated by shortening or puncturing the code word $A_i=\{A_{i,1}, A_{i,2}, \ldots, A_{i,n}\}$; the new code word may be generated by padding a known bit into the code word $A_i=\{A_{i,1}, A_{i,2}, \ldots, A_{i,n}\}$; or the new code word may be obtained by combining a plurality of code words $A_i=\{A_{i,1}, A_{i,2}, \ldots, A_{i,n}\}$. Certainly, if there is no interleaver 202, the modulator receives the coded bit stream from the coder 201, and $Q_i=\{q_{i,1}, q_{i,2}, \ldots, q_{i,n}\}$ may be processed to obtain the new code word.

Serial-to-parallel conversion may be performed on $A=\{\{A_{1,1}, A_{1,2}, \ldots, A_{1,n}\}, \{A_{2,1}, A_{2,2}, \ldots, A_{2,n}\}, \{A_{3,1}, A_{3,2}, \ldots, A_{3,n}\}, \ldots\}$ in a unit of bit. For example, $A_{1,1}$ is in a first sequence, $A_{1,1}$ and $A_{1,2}$ are in a second sequence, and so on. Alternatively, serial-to-parallel conversion may be performed in a unit of n/m bits. For example, $A_{1,1}, A_{1,2}, \ldots, A_{1,n/m}$ are in a first sequence, and $A_{1,(n/m)+1}, A_{1,(n/m)+2}, \ldots, A_{1,2(n/m)}$ are in a second sequence. Certainly, another conversion method may also be used, and bits of the code word $A_1$ and bits of the code word $A_2$ may even alternately appear in one sequence, provided that one code word is equally divided into n/m parts. In this embodiment, one code word only needs to be equally divided into n/3 parts.

As shown in FIG. 2A, the first sequence in this embodiment of this application includes n/3 delayers 3032 marked as T, and a quantity of delayed bits is n/3. Certainly, in another embodiment, the second sequence or the third sequence may include n/3 delayers 3032.

The mapper 2033 is configured to map three input bit sequences into a symbol sequence S. For ease of description, every three parallel bits in the three input bit sequences are referred to as one modulation sequence, and each modulation sequence may be mapped into one symbol.

An input bit stream of the mapper 2033 is shown in FIG. 3A. X represents 0 or 1 and may be set by a user, and $A_i$ indicates that a bit is from a code word $A_i$. For example, in an $n^{th}$ modulation sequence shown in a dashed circle, $d_{1,n}$ is from a code word $A_2$, and other bits $d_{2,n}$ and $d_{3,n}$ are from a code word $A_3$. That is, input bits corresponding to the $n^{th}$ modulation sequence are separately from the code word $A_2$ and the code word $A_3$, provided that first bits corresponding to n/3 first-type symbols are from the first code word, and second bits corresponding to n/3 second-p e symbols are also from the first code word. For example, as shown in FIG. 3A, $$\frac{n}{3}$$

symbols from the first symbol to a $$\frac{n^{th}}{3}$$

symbol are first-type symbols, and second bits corresponding to the $$\frac{n}{3}$$

symbols are from the code word $A_1$; and $$\frac{n}{3}$$

symbols from a $$\left(\frac{n}{3}+1\right)^{th}$$

symbol to a $$\frac{2n^{th}}{3}$$

symbol are second-type symbols, and first bits corresponding to the $$\frac{n}{3}$$

symbols are also from the code word $A_1$.

Figure 2B:
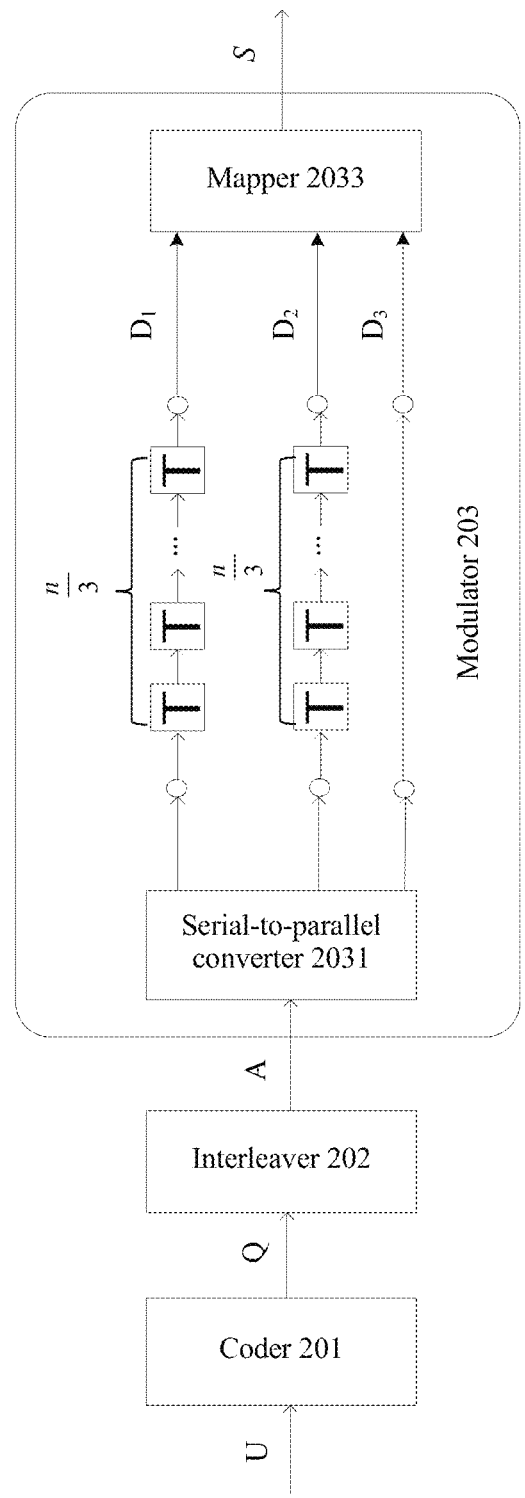
FIG. 2B is a structural diagram of another transmit end device according to an embodiment of this application.

As shown in FIG. 2B, FIG. 2B is a structural diagram of a transmit end device according to an embodiment of this application. A difference between FIG. 2B and FIG. 2A is that a second sequence in FIG. 2B also includes n/3 delayers 3032.

Figure 3B:
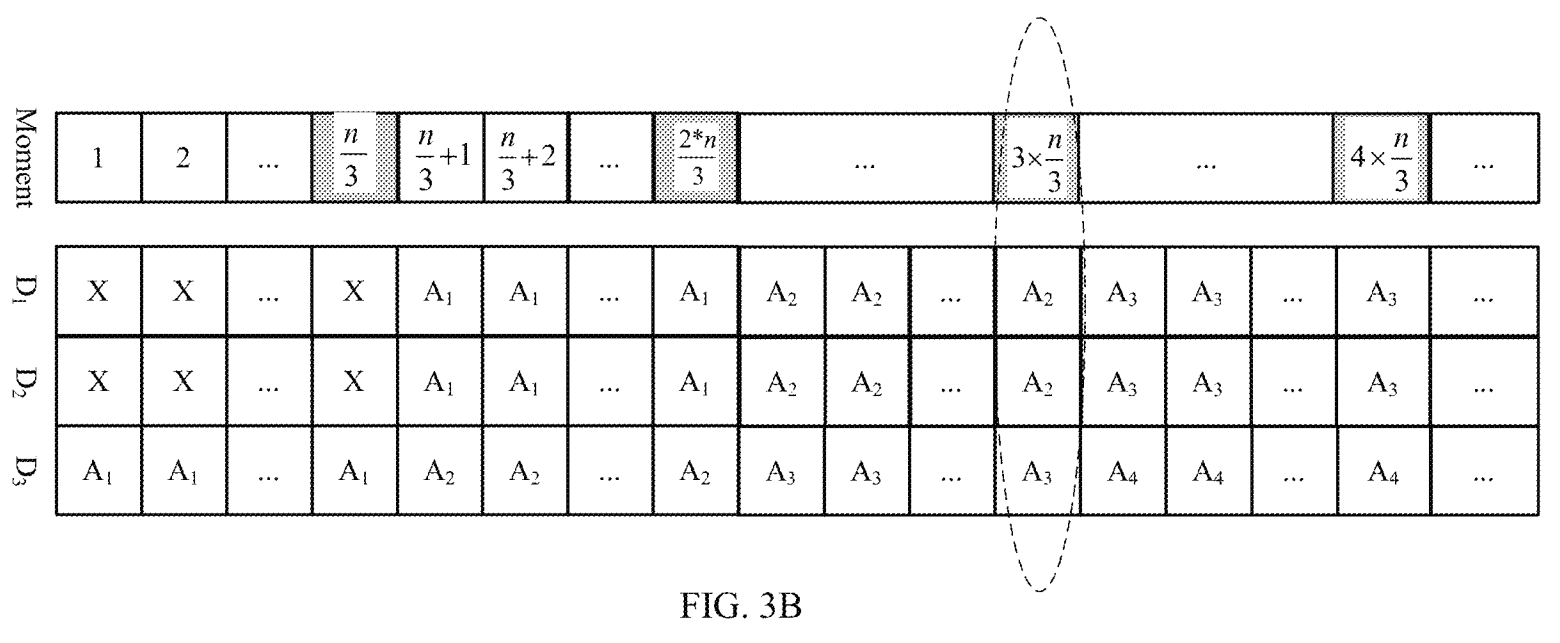

An input bit stream of the mapper 2033 is shown in FIG. 3B. X represents 0 or 1 and may be set by a user, $A_i$ indicates that a bit is from a code word $A_i$, and $d_{i,j}$ indicates a bit that is of a bit stream $D_i$ and that is input into a modulation sequence j. For example, in an $n^{th}$ modulation sequence shown in a dashed circle, $d_{1,n}$ and $d_{2,n}$ are from a code word $A_2$, and a bit $d_{3,n}$ is from a code word $A_3$, that is, input bits corresponding to the $n^{th}$ modulation sequence are separately from the code word $A_2$ and the code word $A_3$.

Figure 2C:
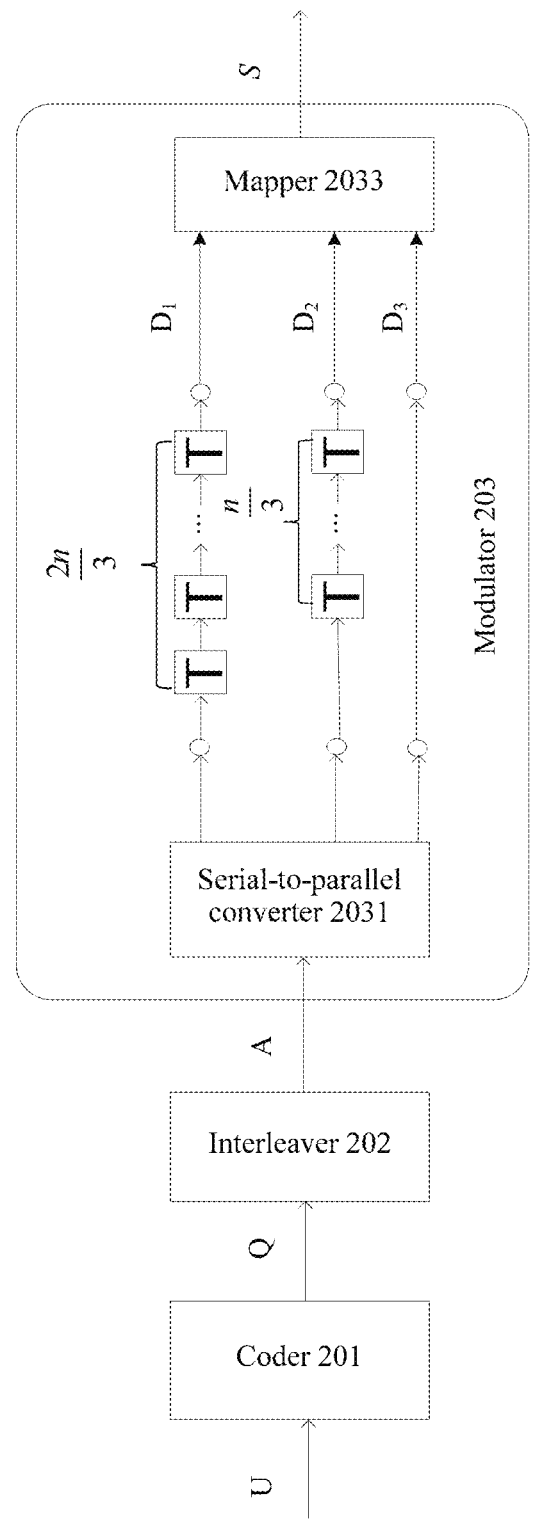
FIG. 2C is a structural diagram of still another transmit end device according to an embodiment of this application.

As shown in FIG. 2C, FIG. 2C is a structural diagram of a transmit end device according to an embodiment of this application. A difference between FIG. 2C and FIG. 2B is that a first sequence in FIG. 2C includes 2(n/3) delayers 3032.

An input bit stream of the mapper 2033 is shown in FIG. 3C. X represents 0 or 1 and may be set by a user, $A_i$ indicates that a bit is from a code word $A_i$, and $d_{i,j}$ indicates a bit that is of a bit stream $D_i$ and that is input into a modulation sequence j. For example, in an $n^{th}$ modulation sequence shown in a dashed circle, $d_{1,n}$ is from a code word $A_1$, $d_{2,n}$ is from a code word $A_2$, and $d_{3,n}$ is from a code word $A_3$, that is, input bits corresponding to the $n^{th}$ modulation sequence are separately from the code word $A_1$, the code word $A_2$, and the code word $A_3$.

In another embodiment, another modulation scheme different from the 8QAM modulation may be used. For $2^m$QAM modulation, m may be another value that is at least 3.

Figure 2D:
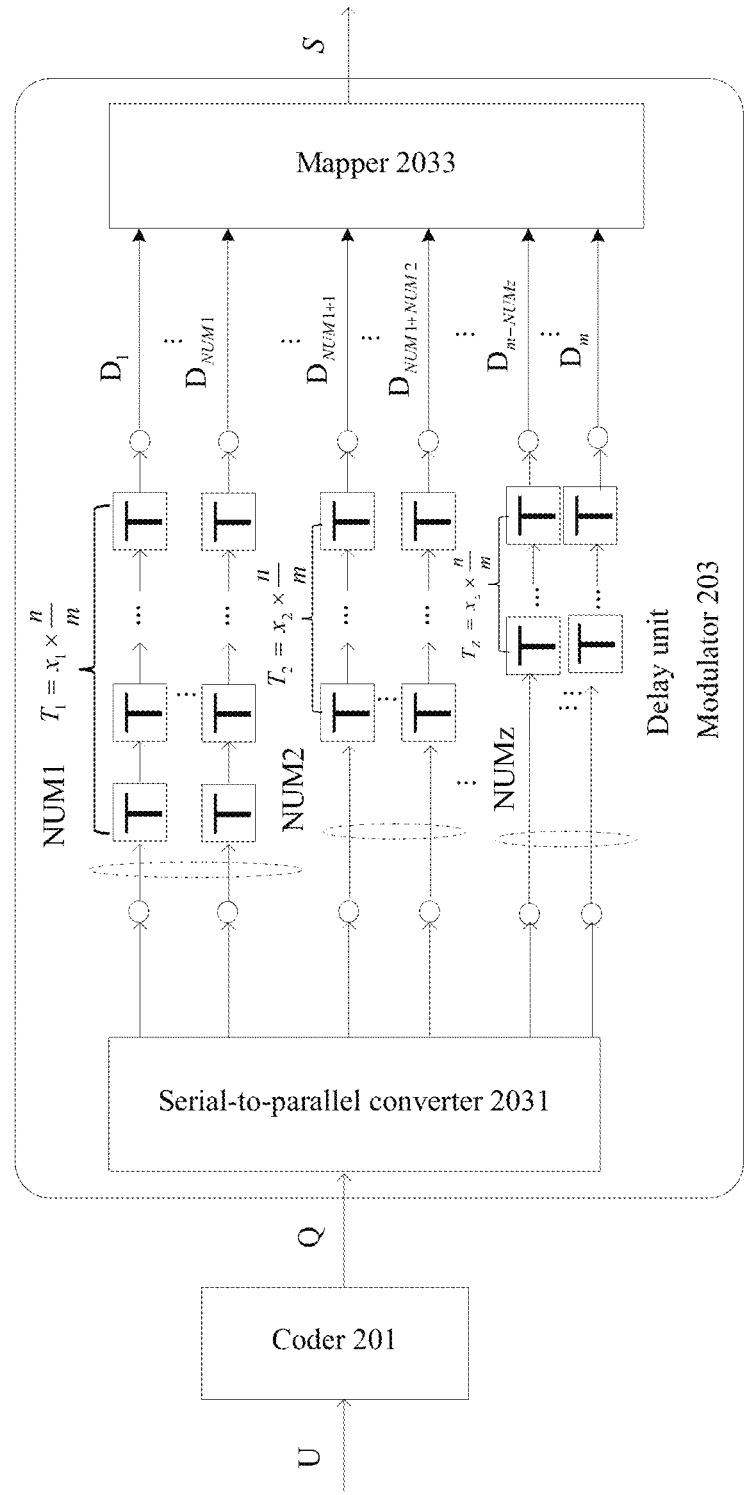
FIG. 2D is a structural diagram of still another transmit end device according to an embodiment of this application.

As shown in FIG. 2D, FIG. 2D is a structural diagram of a transmit end device according to an embodiment of this application, and main differences between FIG. 2D and FIG. 2A are as follows:

A serial-to-parallel converter 2031 in FIG. 2D directly receives a coded bit stream from a coder 201, and the coded bit stream may be, for example, Q={{$q_{1,1}$, $q_{1,2}$, ..., $q_{1,n}$}, {$q_{2,1}$, $q_{2,2}$, ..., $q_{2,n}$}, {$q_{3,1}$, $q_{3,2}$, ..., $q_{3,n}$}, ...}.

The serial-to-parallel converter 2031 in FIG. 2D performs serial-to-parallel conversion on the receive coded bit stream to convert the coded bit stream into m sequences. Each code word $Q_i$={$q_{i,1}$, $q_{i,2}$, ..., $q_{i,n}$} is equally divided into m parts respectively corresponding to m sequences.

As shown in FIG. 2D, there are $NUM_i$ sequences each of which includes $x_i*(n/m)$ delayers 3032, where $NUM_i$ is an integer greater than or equal to 1, $x_i$ is an integer greater than or equal to 0. For example, there are $NUM_i$ sequences each of which includes $x_1*(n/m)$ delayers 3032, $NUM_2$ sequences each of which includes $x_2*(n/m)$ delayers 3032, and $NUM_z$ sequences each of which includes $x_z*(n/m)$ delayers 3032. Preferably, $x_i > x_{i+1}$ may be set.

The mapper 2033 in FIG. 2D is configured to map m input bit sequences into a symbol sequence. For ease of description, every m parallel bits in the m input bit sequences are referred to as one modulation sequence, and each modulation sequence may be mapped into one symbol $s^j$. In the $2^m$QAM modulation, there are in total $2^m$ modulation symbols $\{s^1, s^2, \ldots, s^{2^m}\}$, and each modulation symbol $s^j$ is mapped from m bits ($b^1, b^2, \ldots b^m$).

Figure 3D:
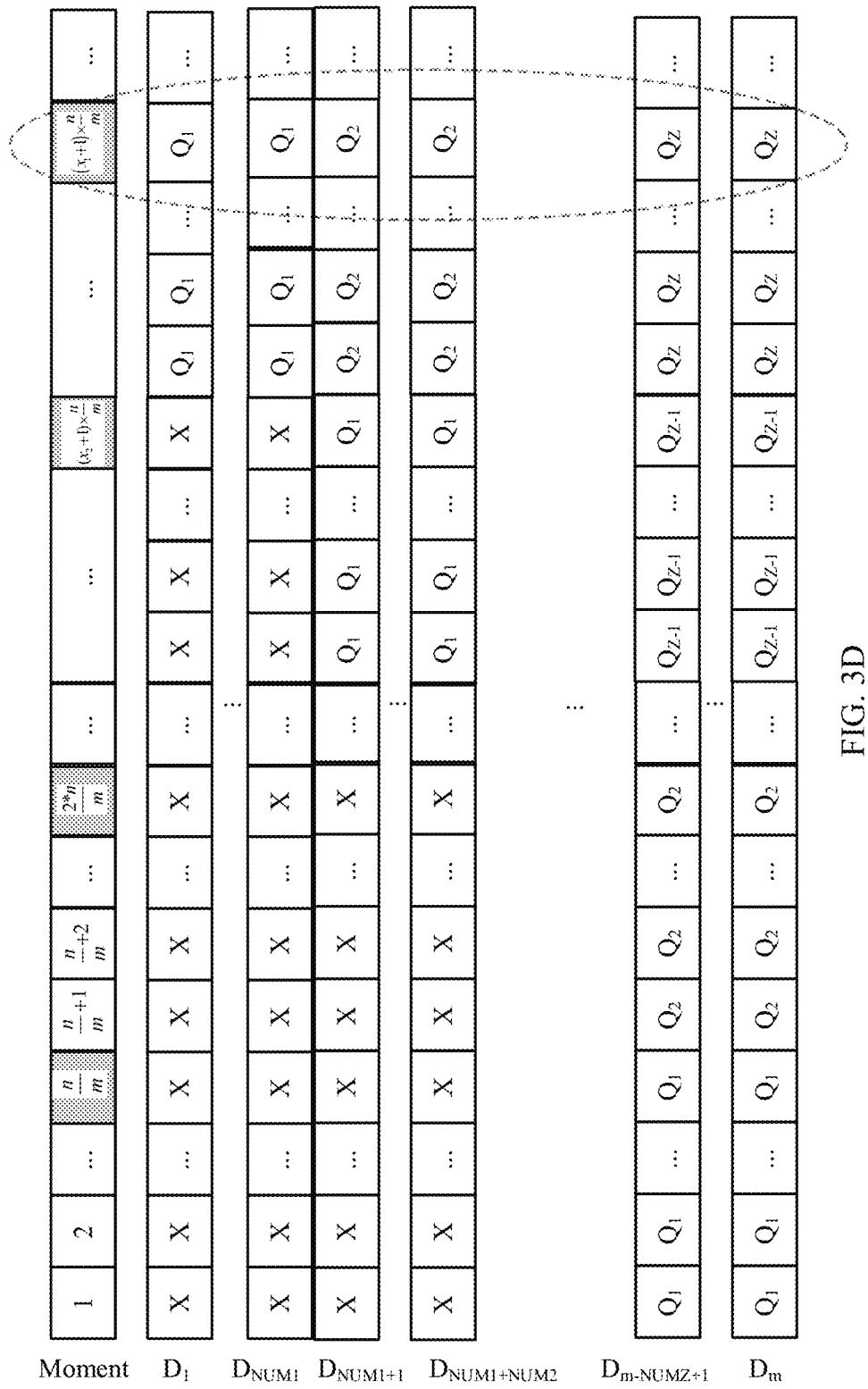
FIG. 3D is a schematic diagram of an input bit stream of still another mapper according to an embodiment of this application.

An input bit stream of the mapper 2033 is shown in FIG. 3D. X represents 0 or 1 and may be set by a user, and $A_i$ indicates that a bit is from a code word $A_i$. For example, for a $(x_1+1)*(n/m)^{th}$ modulation sequence shown in a dashed circle, $d_{1,(x1+1)*(n/m)}$, $d_{2,(x1+1)*(n/m)}$, . . . , and $d_{NUM1,(x1+1)*(n/m)}$ are from a code word $A_1$; $d_{NUM1+1,(x1+1)*(n/m)}$, $d_{NUM1+2,x1*(n/m)}$, . . . , and $d_{NUM1+NUM2,x1*(n/m)}$ are from a code word $A_2$; and $d_{m-NUMZ+1,(x1+1)*(n/m)}$, $d_{m-NUMZ+2,(x1+1)*(n/m)}$, . . . , and $d_{m,(x1+1)*(n/m)}$ are from a code word $A_z$. That is, input bits corresponding to the $(x_1+1)*(n/m)^{th}$ modulation sequence are separately from $A_1, A_2, \ldots,$ and $A_z$. That is, the bits corresponding to the $(x_1+1)*(n/m)^{th}$ modulation sequence are from Z code words, that is, the bits include $NUM_1$, $NUM_2, \ldots,$ and $NUM_z$ that are respectively extracted from the Z code words $A_1, A_2, \ldots,$ and $A_z$. $NUM_i$ is an integer that is greater than or equal to 1 and less than or equal to m, Z is an integer that is greater than 1 but less than or equal to m, and $$\sum_{i=1}^{Z} NUM_i = m.$$

When m=3, one $2^3$QAM symbol is mapped from three bits that are separately from Z code words separately denoted as $A_i$, where $0 < i \le Z$, and a quantity of bits included in a code word $A_i$ is denoted as $NUM_i$. For the embodiment shown in FIG. 2D, if m=3, Z=2, $NUM_1=1$, and $NUM_2=2$, the embodiment of FIG. 2A can be obtained; if m=3, Z=2, $NUM_1=2$, and $NUM_2=1$, the embodiment of FIG. 2B can be obtained; or if m=3, Z=3, $NUM_1=1$, $NUM_2=1$, and $NUM_3=1$, the embodiment of FIG. 2C can be obtained.

When m=4 to 12 and Z has different values, there is a preferred manner in which parameter values of $NUM_i$ are configured. In this configuration manner, $x_i > \chi_i + 1$.

For example, when m=4, the parameter values of $NUM_i$ may be shown in FIG. 7A. Parameter values of $NUM_i$ shown in each row in FIG. 7A may have another arrangement.

When m=5, the parameter values of $NUM_i$ may be shown in FIG. 7B. Parameter values of $NUM_i$ shown in each row in FIG. 7B may have another arrangement.

When m=6, the parameter values of $NUM_i$ may be shown in FIG. 7C. Parameter values of $NUM_i$ shown in each row in FIG. 7C may have another arrangement.

When m=7, the parameter values of $NUM_i$ may be shown in FIG. 7D. Parameter values of $NUM_i$ shown in each row in FIG. 7D may have another arrangement.

When m=8, the parameter values of $NUM_i$ may be shown in FIG. 7E. Parameter values of $NUM_i$ shown in each row in FIG. 7E may have another arrangement.

When m=9, the parameter values of $NUM_i$ may be shown in FIG. 7F. Parameter values of $NUM_i$ shown in each row in FIG. 7F may have another arrangement.

When m=10, the parameter values of $NUM_i$ may be shown in FIG. 7G. Parameter values of $NUM_i$ shown in each row in FIG. 7G may have another arrangement.

When m=11, the parameter values of $NUM_i$ may be shown in FIG. 7H. Parameter values of $NUM_i$ shown in each row in FIG. 7H may have another arrangement.

When m=12, the parameter values of $NUM_i$ may be shown in FIG. 7I. Parameter values of $NUM_i$ shown in each row in FIG. 7I may have another arrangement.

When m is greater than 12 and Z has different values, there may be a similar configuration manner, and details are not described herein.

In this embodiment of this application, for the $2^m$QAM modulation, the mapped symbol is corresponding to one constellation point in $2^m$ constellation points in a $2^m$ constellation diagram, a minimum Euclidean distance between the constellation points in the $2^m$ constellation diagram is a first Euclidean distance. Preferably, a minimum Euclidean distance between constellation points that are in the $2^m$ constellation diagram and that may be corresponding to the first-type symbols after bits from the first code word are determined is a second Euclidean distance, and the second Euclidean distance is greater than the first Euclidean distance.

There are in total $2^m$ modulation symbols $\{s^1, s^2, \ldots s^{2^m}\}$ in the $2^m$QAM modulation scheme, which are corresponding to $2^m$ constellation points in the modulation constellation diagram. Each modulation symbol $s^j$ is mapped from m bits ($b^1, b^2, \ldots b^m$).

It is assumed that the m bits ($b^1, b^2, \ldots b^m$) may be mapped into $2^m$ symbols that are denoted as a set $S_0$, and a minimum Euclidean distance between the symbols is $W_0$.

First Segmentation:

In the set, when $b^1=b^2= \ldots =b^{NUM1}=0$, corresponding symbols form a set $S_{0,0}$ that is a subset of $S_0$, and a minimum distance between the symbols in the subset is $W_{1,0}$. That is, $b^1, b^2, \ldots, b^{NUM1}$ are bits from the first code word. After it is determined that $b^1=b^2= \ldots =b^{NUM1}=0$, the minimum Euclidean distance between the possible constellation points is $W_{1,0}$.

In the set, when $b^1=b^2= \ldots =b^{NUM1}=1$, corresponding symbols form a set $S_{0,1}$ that is a subset of $S_0$, and a minimum distance between the symbols is $W_{1,1}$, that is, $b^1, b^2, \ldots, b^{NUM1}$ are bits from the first code word. After it is determined that $b^1=b^2= \ldots =b^{NUM1}=1$, the minimum Euclidean distance between the possible constellation points may be $W_{1,1}$.

In addition, $W_1=\min(W_{1,0}, W_{1,1})$, and preferably, $W_1 > W_0$.

Further, Second Segmentation:

In the set, when $b^1=b^2= \ldots =b^{NUM1}=0$ and $b^{NUM1+1}=b^{NUM1+2}= \ldots =b^{NUM2}=0$, corresponding symbols form a set $S_{1,0,0}$ that is a subset of $S_{1,0}$, and a minimum distance between the symbols in the subset is $W_{2,0,0}$.

In the set, when $b^1=b^2=\ldots=b^{NUM_1}=0$ and $b^{NUM_1+1}=b^{NUM_1+2}=\ldots=b^{NUM_2}=1$, corresponding symbols form a set $S_{1,0,1}$ that is a subset of $S_{1,0}$, and a minimum distance between the symbols in the subset is $W_{2,0,1}$.

In the set, when $b^1=b^2=\ldots=b^{NUM_1}=1$ and $b^{NUM_1+1}=b^{NUM_1+2}=\ldots=b^{NUM_2}=0$, corresponding symbols form a set $S_{1,0,0}$ that is a subset of $S_{1,0}$, and a minimum distance between the symbols in the subset is $W_{2,1,0}$.

In the set, when $b^1=b^2=\ldots=b^{NUM_1}=1$ and $b^{NUM_1+1}=b^{NUM_1+2}=\ldots=b^{NUM_2}=1$, corresponding symbols form a set $S_{1,0,1}$ that is a subset of $S_{1,0}$, and a minimum distance between the symbols in the subset is $W_{2,1,1}$.

In addition, $W_2=\min(W_{2,0,0}, W_{2,0,1}, W_{2,1,0}, W_{2,1,1})$, and preferably, $W_2>W_1$.

. . . .

$(z-1)^{th}$ Segmentation:

After the set $S_0$ is segmented for z times, $2^z$ sets are generated, and each set is a part of $S_0$. After the $(z-1)^{th}$ segmentation, a minimum Euclidean distance in the set is denoted as $W_{z-1}$.

Preferably, $W_z>W_{z-1}$.

The following uses the 8QAM modulation as an example for description. It is assumed that Z=2, $NUM_1=1$, and $NUM_2=2$, which is the case shown in FIG. 2A and FIG. 3A.

There are in total eight modulation symbols $\{s_1, \ldots, s_6, s_8\}$ in an 8QAM modulation scheme, which are corresponding to eight constellation points in the constellation diagram. Each modulation symbol $s_j$ is mapped from three data bits $(d_1, d_2, d_3)$.

Figure 4A:
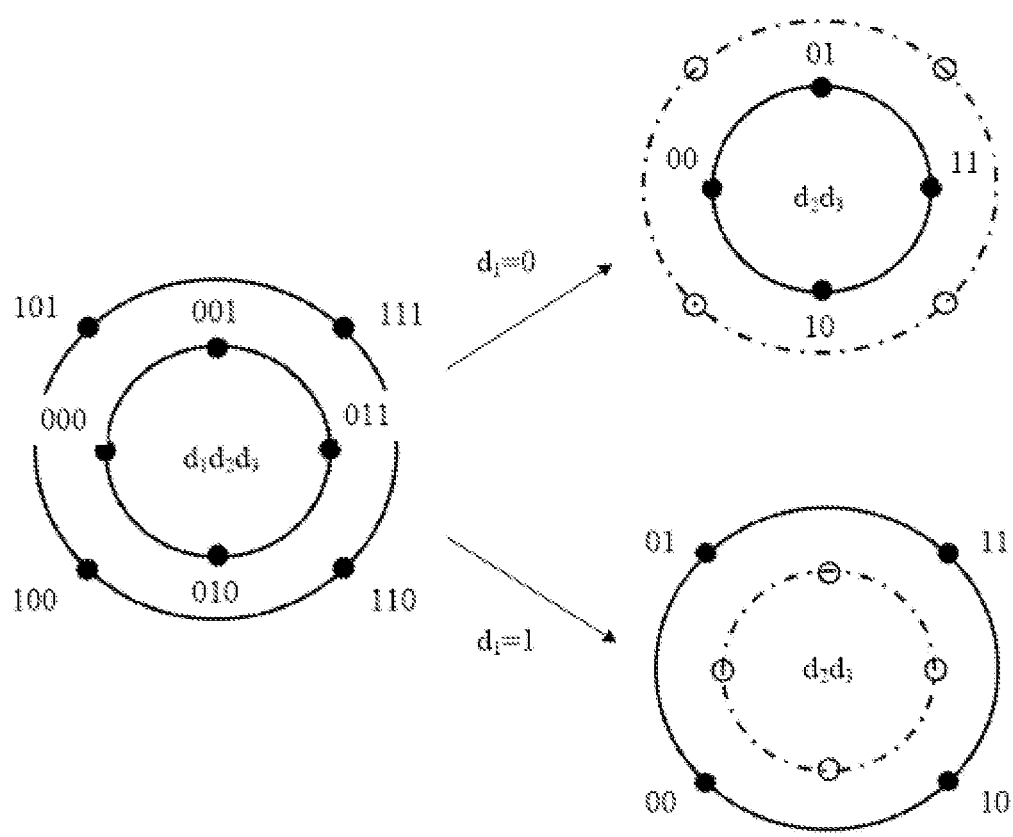
FIG. 4A is an 8QAM constellation diagram according to an embodiment of this application.

Table 2 shows a method for mapping three bits into a complex number symbol s=I+jQ. A constellation diagram obtained by means of mapping according to Table 1 is shown in FIG. 4A.

TABLE 2

Constellation point mapping in 8 QAM

| Bits | I | Q |
|---|---|---|
| 000 | −2 | 0 |
| 001 | 0 | 2 |
| 011 | 2 | 0 |
| 010 | 0 | −2 |
| 110 | 3 | −3 |
| 111 | 3 | 3 |
| 101 | −3 | 3 |
| 100 | −3 | −3 |

It can be seen from the figure that, when a first bit is determined, constellation points that may be corresponding to the symbol may be considered as a QPSK constellation diagram. For example, when the first bit is 0, the constellation points that may be corresponding to the symbol are four constellation points shown in an inner circle. The four constellation points may be considered as a QPSK constellation diagram. When the first bit is 1, the constellation points that may be corresponding to the symbol are four constellation points shown in an outer circle. The four constellation points may also be considered as a QPSK constellation diagram. It is well known that a minimum Euclidean distance between QPSK constellation points is greater than a minimum Euclidean distance between 8QAM constellation points. When the first bit is known, it means that the Euclidean distance is enlarged.

Figure 4B:
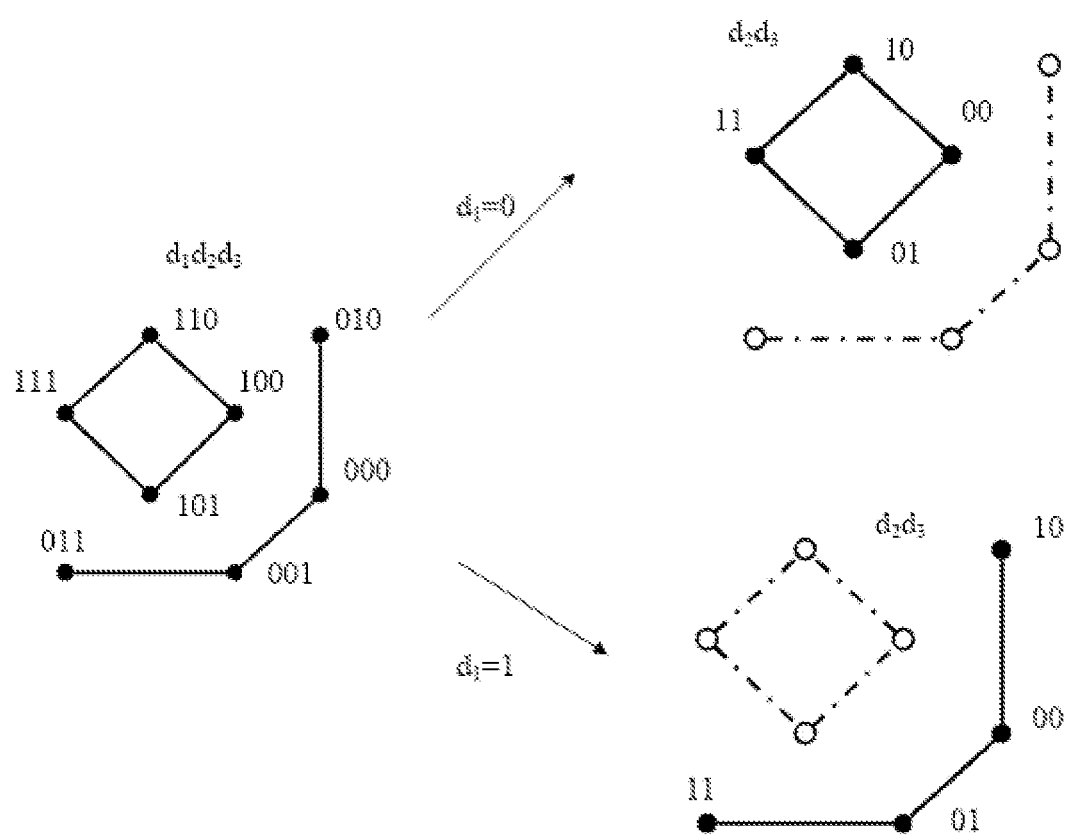
FIG. 4B is another 8QAM constellation diagram according to an embodiment of this application.

Table 3 shows another method for mapping three bits into a complex number symbol s=I+jQ. A constellation diagram obtained by means of mapping according to Table 3 is shown in FIG. 4B.

TABLE 3

Constellation point mapping in 8 QAM

| Bits | I | Q |
|---|---|---|
| 000 | 3 | −1 |
| 001 | 1 | −3 |
| 010 | 3 | 3 |
| 011 | −3 | −3 |
| 100 | 1 | 1 |
| 101 | −1 | −1 |
| 110 | −1 | 3 |
| 111 | −3 | 1 |

It can be seen from FIG. 4B that, after a first bit is determined, constellation points that may be corresponding to the symbol may be considered as a QPSK constellation diagram. When the first bit is 0, the constellation points that may be corresponding to the symbol are a square constellation diagram (a solid line part) shown in an upper-right diagram. When the first bit is 1, the constellation points that may be corresponding to the symbol are a lower-right constellation diagram (a solid line part). A Euclidean distance between constellation points in two right constellation diagrams is greater than a Euclidean distance between eight points in a left diagram. When the first bit is known, it means that the Euclidean distance is enlarged.

Figure 2E:
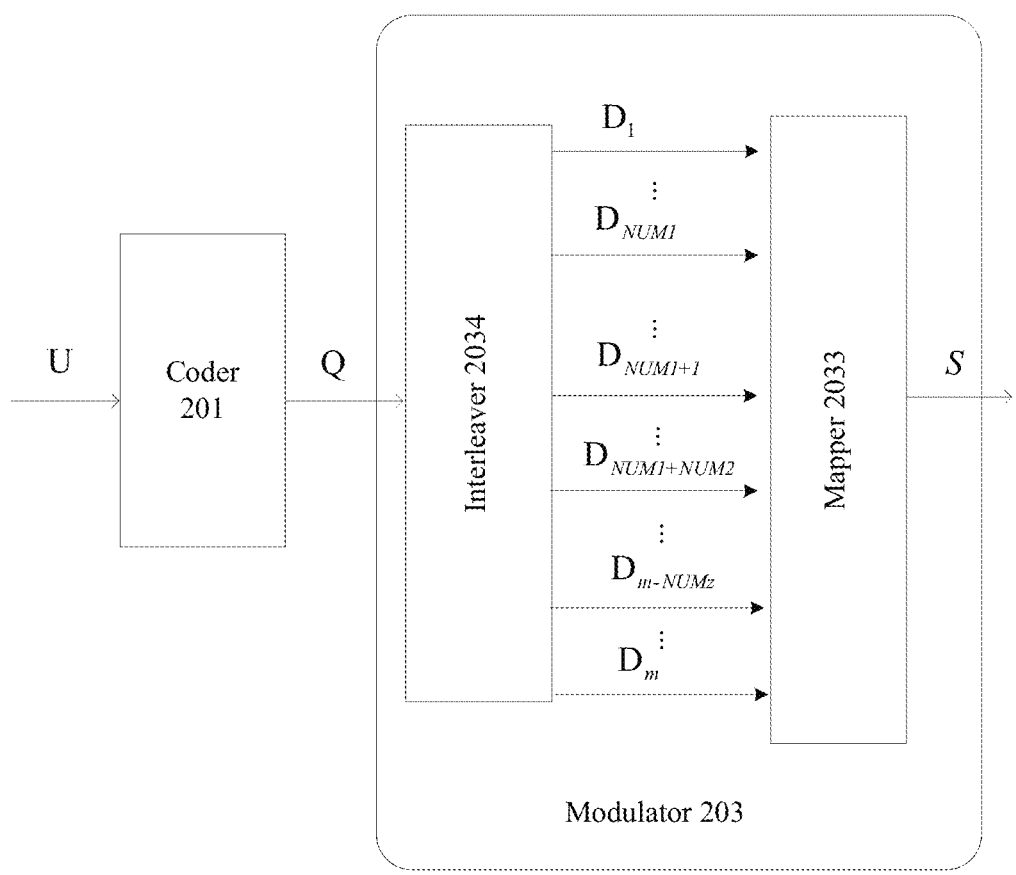
FIG. 2E is a structural diagram of still another transmit end device according to an embodiment of this application.

As shown in FIG. 2E, FIG. 2E is a structural diagram of a transmit end device according to an embodiment of this application. A difference between FIG. 2E and FIG. 2A is that a modulator in FIG. 2E includes an interleaver 2034 and a mapper 2033, and does not include an interleaver 202.

The interleaver 2032 interleaves a received coded bit stream. For example, the received coded bit stream is $Q=\{\{q_{1,1}, q_{1,2}, \ldots, q_{1,n}\}, \{q_{2,1}, q_{2,2}, \ldots, q_{2,n}\}, \{q_{3,1}, q_{3,2}, \ldots, q_{3,n}\} \ldots \}$, and it is assumed that n=12.

It is assumed that $A=\{a_1, a_2, a_3, a_4, a_5, a_6, a_7, a_8, a_9, a_{10}, a_{11}, a_{12}, \ldots\}=\{\{Q_{1,1}, Q_{1,2}, Q_{1,3}, Q_{1,4}, Q_{1,5}, Q_{1,6}, Q_{1,7}, Q_{1,8}, Q_{1,9}, Q_{1,10}, Q_{1,11}, Q_{1,12}\}, \{Q_{2,1}, Q_{2,2}, Q_{2,3}, Q_{2,4}, Q_{2,5}, Q_{2,6}, Q_{2,7}, Q_{2,8}, Q_{2,9}, Q_{2,10}, Q_{2,11}, Q_{2,12}\}, \ldots \}$, that is, $\{a_1, a_2, a_3, a_4, a_5, a_6, a_7, a_8, a_9, a_{10}, a_{11}, a_{12}\}$ is corresponding to a code word $Q1=\{Q_{1,1}, Q_{1,2}, Q_{1,3}, Q_{1,4}, Q_{1,5}, Q_{1,6}, Q_{1,7}, Q_{1,8}, Q_{1,9}, Q_{1,1}, Q_{1,11}, Q_{1,12}\}$, and a bit $a_{13}$ to a bit $a_{24}$ are corresponding to a code word A2.

The following describes processing performed by the interleaver 2034 on a sequence A, and m sequences are output after the processing. The following describes two typical interleaving rules.

In Rule 1, the output m sequences are respectively:

$$D_1 = \{\underbrace{X, X, X, \ldots, X}_{x_1 \times \frac{n}{m}}, a_1, a_{m+1}, a_{2m+1}, \ldots\}$$

M $$D_{NUM_1} = \{\underbrace{X, X, X, \ldots, X}_{x_1 \times \frac{n}{m}}, a_{NUM_1}, a_{m+NUM_1}, a_{2m+NUM_1}, \ldots\}$$

$$D_{NUM_1+1} = \{\underbrace{X, X \ldots, X}_{x_2 \times \frac{n}{m}}, a_{NUM_1+1}, a_{m+NUM_1+1}, a_{2m+NUM_1+1}, \ldots\}$$

M $$D_{NUM_1+NUM_2} = \{\underbrace{X, X \ldots, X}_{x_2 \times \frac{n}{m}}, a_{NUM_1+NUM_2}, a_{m+NUM_1+NUM_2}, a_{2m+NUM_1+NUM_2}, \ldots\}$$

M $$D_{m-NUM_Z+1} = \{\underbrace{X, \ldots X}_{x_Z \times \frac{n}{m}}, a_{m-NUM_Z+1}, a_{2m-NUM_Z+1}, a_{3m-NUM_Z+1}, \ldots\}$$

M $$D_m = \{\underbrace{X, \ldots X}_{x_Z \times \frac{n}{m}}, a_m, a_{2m}, a_{3m}, \ldots\}$$

In this case, an interleaving rule of the interleaver includes: outputting the m sequences; and outputting an interleaved bit $a_L$ in a (row=L % m)$^{th}$ row and a (col=$\lfloor L/m \rfloor$++DY$_L$)$^{th}$ column. L % m is a reminder of L/m, and $\lfloor L/m \rfloor$ is an integer obtained after L/m is rounded off. It can be learned that when row=NUM$_{i-1}$+1, NUM$_{i-1}$+2, . . . , NUM$_i$, $$DY_L = x_i \times \left(\frac{n}{m}\right).$$

In this interleaving rule, if m=3, $x_1$=2, $x_2$=1, and $x_3$=0,
D1={X, X, X, X, X, X, X, X, $a_1$, $a_4$, $a_7$, $a_{10}$, $a_{13}$, $a_{16}$, $a_{19}$, $a_{22}$, . . . }
D2={X, X, X, X, $a_2$, $a_5$, $a_8$, $a_{11}$, $a_{14}$, $a_{17}$, $a_{20}$, $a_{23}$, . . . }; and
D3={$a_3$, $a_6$, $a_9$, $a_{12}$, $a_{15}$, $a_{18}$, $a_{21}$, $a_{24}$, . . . }.
That is,
D1={X, X, X, X, X, X, X, X, $Q_{1,1}$, $Q_{1,4}$, $Q_{1,7}$, $Q_{1,10}$, $Q_{2,1}$, $Q_{2,4}$, $Q_{2,7}$, $Q_{2,10}$, . . . };
D2={X, X, X, X, $Q_{1,2}$, $Q_{1,5}$, $Q_{1,8}$, $Q_{1,11}$, $Q_{2,2}$, $Q_{2,5}$, $Q_{2,8}$, $Q_{2,11}$, . . . }; and
D3={$Q_{1,3}$, $Q_{1,6}$, $Q_{1,9}$, $Q_{1,12}$, $Q_{2,3}$, $Q_{2,6}$, $Q_{2,9}$, $Q_{2,12}$, . . . }.
In Rule 2, the output m sequences are respectively:

$$D_1 = \{\underbrace{X, X, X, \ldots, X}_{x_1 \times \frac{n}{m}}, a_1, a_2, \ldots, a_{n/m} \ldots\}$$

M $$D_{NUM_1} = \{\underbrace{X, X, X, \ldots, X}_{x_1 \times \frac{n}{m}}, a_{(NUM_1-1)\times n/m+1}, a_{(NUM_1-1)\times n/m+2}, \ldots, a_{NUM_1 \times n/m}, \ldots\}$$

$$D_{NUM_1+1} = \{\underbrace{X, X \ldots, X}_{x_2 \times \frac{n}{m}}, a_{NUM_1 \times n/m+1}, a_{NUM_1 \times n/m+2}, \ldots, a_{(NUM_1+1)\times n/m}, \ldots\}$$

M $$D_{NUM_1+NUM_2} = \{\underbrace{X, X \ldots, X}_{x_2 \times \frac{n}{m}}, a_{(NUM_1+NUM_2-1)\times n/m+1}, a_{(NUM_1+NUM_2-1)\times n/m+2}, \ldots, a_{(NUM_1+NUM_2)\times n/m}, \ldots\}$$

M

-continued $$D_{m-NUM_Z+1} = \{\overbrace{X, \ldots X}^{x_Z \times \frac{n}{m}}, a_{(m-NUM_Z) \times n/m+1}, a_{(m-NUM_Z) \times n/m+2}, \ldots, a_{(m-NUM_Z+1) \times n/m}, \ldots\}$$

M $$D_m = \{\overbrace{X, \ldots X}^{x_Z \times \frac{n}{m}}, a_{(m-1) \times n/m+1}, a_{(m-1) \times n/m+2}, \ldots, a_{m \times n/m}, \ldots\}$$

In this case, an interleaving rule of the interleaver includes: outputting the m sequences; and outputting an interleaved bit $a_L$ in a $(row=(L-\lfloor L/n \rfloor \times n)/(n/m)+1)^{th}$ row and a $(col=\lfloor L/n \rfloor \times (n/m)+L \% (n/m)+DY_L)^{th}$ column. L % (n/m) is a reminder of L/(n/m), and $\lfloor L/m \rfloor$ is an integer obtained after L/m is rounded off. It can be learned that when row=$NUM_{i-1}+1$, $NUM_{i-1}+2$, ..., $NUM_i$, $$DY_L = x_i \times \left(\frac{n}{m}\right).$$

In this interleaving rule, if m=3, $x_1$=2, $x_2$=1, and $x_3$=0,
D1={X, X, X, X, X, X, X, X, $a_1$, $a_2$, $a_3$, $a_4$, $a_{13}$, $a_{14}$, $a_{15}$, $a_{16}$, . . . };
D2={X, X, X, X, $a_5$, $a_6$, $a_7$, $a_8$, $a_{17}$, $a_{18}$, $a_{19}$, $a_{20}$, . . . }; and
D3={$a_9$, $a_{10}$, $a_{11}$, $a_{12}$, $a_{21}$, $a_{22}$, $a_{23}$, $a_{24}$, . . . }.
That is,
D1={X, X, X, X, X, X, X, X, $Q_{1,1}$, $Q_{1,2}$, $Q_{1,3}$, $Q_{1,4}$, $Q_{2,1}$, $Q_{2,2}$, $Q_{2,3}$, $Q_{2,4}$, . . . };
D2={X, X, X, X, $Q_{1,5}$, $Q_{1,6}$, $Q_{1,7}$, $Q_{1,8}$, $Q_{2,5}$, $Q_{2,6}$, $Q_{2,7}$, $Q_{2,8}$, . . . }; and
D3={$Q_{1,9}$, $Q_{1,10}$, $Q_{1,11}$, $Q_{1,12}$, $Q_{2,9}$, $Q_{2,10}$, $Q_{2,11}$, $Q_{2,12}$, . . . }.

In an actual application, there may be a plurality of interleaving rules, provided that each sequence in M sequences includes N/M bits from the first code word, and a symbol finally obtained by means of mapping meets that first bits corresponding to N/M first-type symbols are from the first code word, and second bits corresponding to N/M second-type symbols are from the first code word. Bits may be interleaved in a disrupted order, and bits of two code words may also be interleaved in a disrupted order.

In this embodiment of this application, a code word sequence is mapped into M sequences, each sequence includes N/M bits from the first code word; the M sequences are mapped into a symbol sequence, where each symbol is corresponding to M bits, the M bits are respectively from the M sequences, the first bits corresponding to the N/M first-type symbols are from the first code word, and the second bits corresponding to the N/M second-type symbols are from the first code word. That is, locations of bits related to the first code word in the M sequences are staggered. Some bits in the M bits corresponding to the first-type symbol are from the first code word, and some bits are from another code word. Some bits in the M bits corresponding to the second-type symbol are from the first code word, and some bits are from another code word.

After receiving the first-type symbol, a receive end may demodulate the first-type symbol and the second-type symbol for a first time. After the bits related to the first code word are decoded, the first-type symbol or the second-type symbol may be demodulated again. Because the bits in the first-type symbol and from the first code word are already determined, bits in the first-type symbol and from another code word can be demodulated more accurately.

Figure 5A:
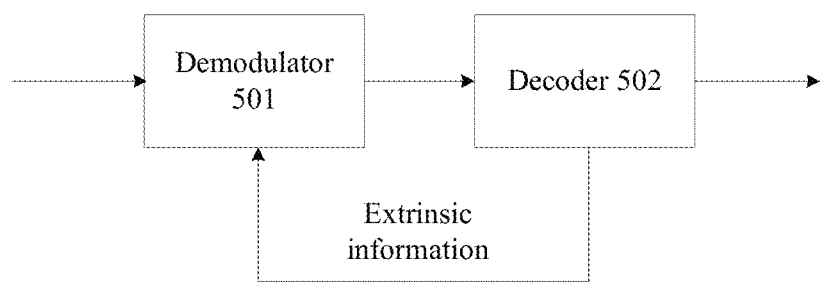
FIG. 5A is a structural diagram of a receive end device according to an embodiment of this application.

As shown in FIG. 5A, FIG. 5A is a structural diagram of a receive end device according to an embodiment of this application. The receive end device includes a demodulator 501 and a decoder 502.

The demodulator 501 is configured to: receive a symbol sequence transmitted by using a channel, where the symbol sequence is a symbol sequence generated in any one of claims 1 to 8; demodulate a first-type symbol to obtain a log-likelihood ratio of a bit from a first code word; and demodulate a second-type symbol to obtain a log-likelihood ratio of a bit from the first code word.

The decoder 502 is configured to perform decoding on log-likelihood ratios of all bits from the first code word to obtain first extrinsic information.

The demodulator 501 is further configured to receive the symbol sequence transmitted by using the channel, and demodulate the second-type symbol by using the first extrinsic information to obtain a log-likelihood ratio of a bit from another code word.

If the first-type symbol further includes a bit from a second code word,
the decoder 502 may further be configured to perform decoding on log-likelihood ratios of all bits from the second code word to obtain second extrinsic information; and
that the demodulator 501 is configured to demodulate the first-type symbol to obtain the log-likelihood ratio of the bit from the first code word includes:
the demodulator 501 is configured to demodulate the first-type symbol by using the second extrinsic information to obtain the log-likelihood ratio of the bit from first code word.

The receive end device may perform receiving by using a plurality of solutions, provided that the bits in the second-type symbol and from another code word are demodulated by using information about the first code word. The following provides a specific implementation apparatus and an implementation solution.

Figure 5B:
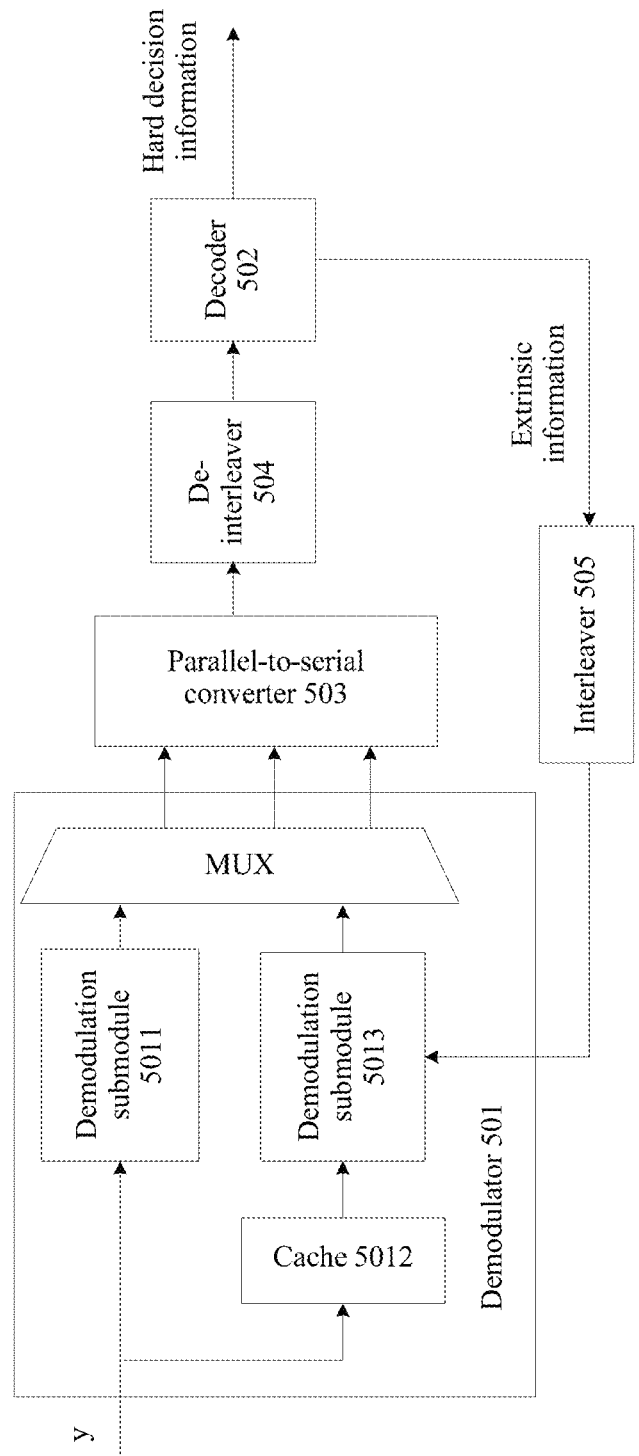
FIG. 5B is a structural diagram of another receive end device according to an embodiment of this application.

As shown in FIG. 5B, FIG. 5B is a structural diagram of another receive end device according to an embodiment of this application. The receive end device includes: a demodulator 501, a parallel-to-serial converter 503, a de-interleaver 504, a decoder 502, and an interleaver 505. The demodulator 501 specifically includes a demodulation submodule 5011, a cache 5012, a demodulation submodule 5013, and a selector 5014.

8QAM is used as an example to describe a receiving method of the receive end device in FIG. 5B. According to the foregoing description of the transmit end in the embodiments related to FIG. 2A and FIG. 3A, each modulation symbol $s^j$ of the 8QAM is mapped from three data bits ($d_1$, $d_2$, $d_3$), where $d_1$ is from a previous code word, and $d_2$ and $d_3$ are from a second code word.

It is assumed that a coded code word is modulated to obtain a modulation symbol s, and a receiving symbol obtained after s passes through a channel is:

$$y = s + n \quad (1)$$

where, n is an additive noise of the channel, and dimensions of the additive noise accord with complex Gaussian distribution whose mean value is 0 and whose variance is $\sigma^2$.

It is assumed that a receiving symbol $y_f$ is mapped from three bits and is denoted as $\{d_1, d_2, d_3\}$, the bit $d_1$ is from a code word $A_i$, and $d_2$, $d_3$ are from a code word $A_{i+1}$.

Figure 6A:
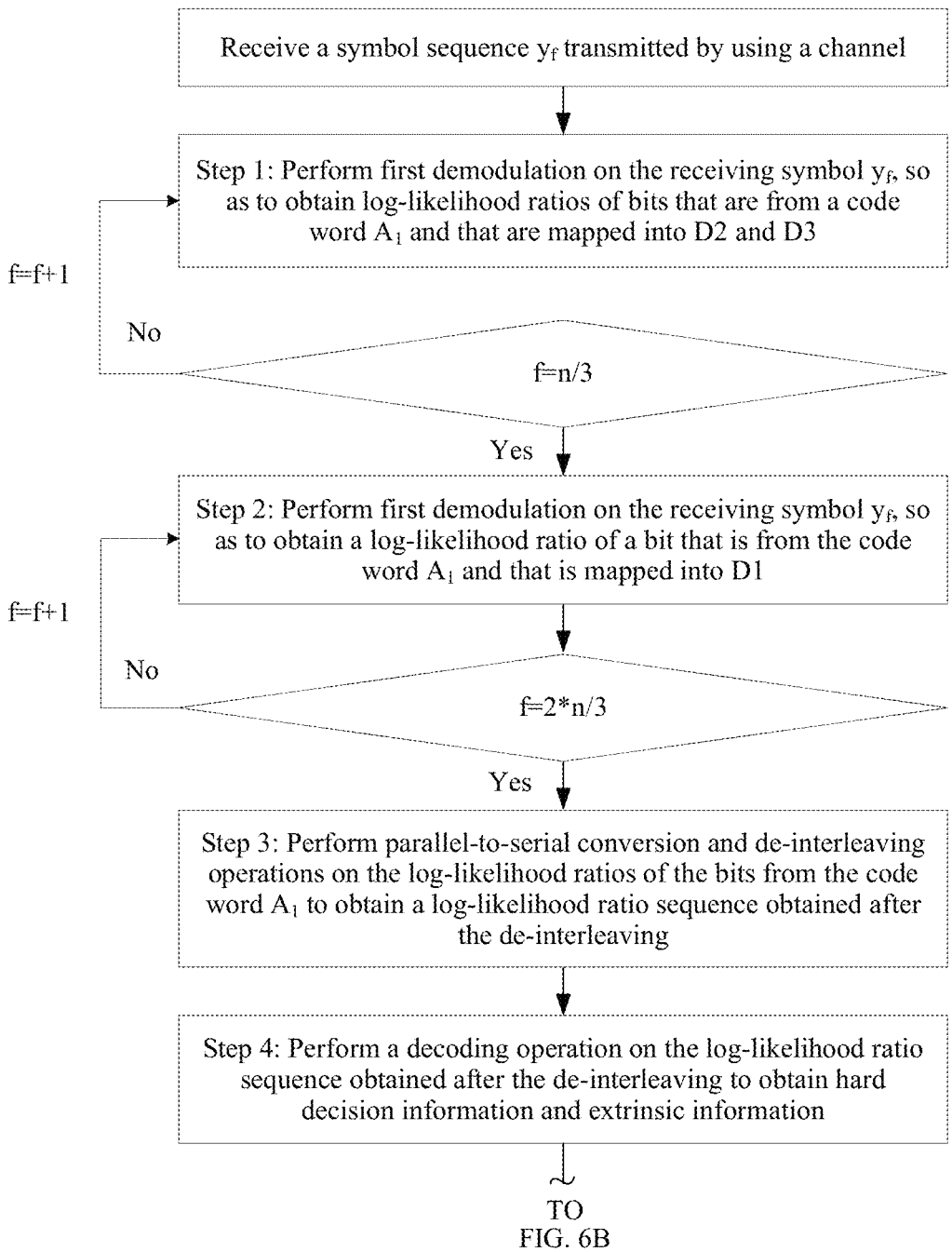
FIG. 6A and FIG. 6B are a processing flowchart of a receive end device according to an embodiment of this application.
Figure 6B:
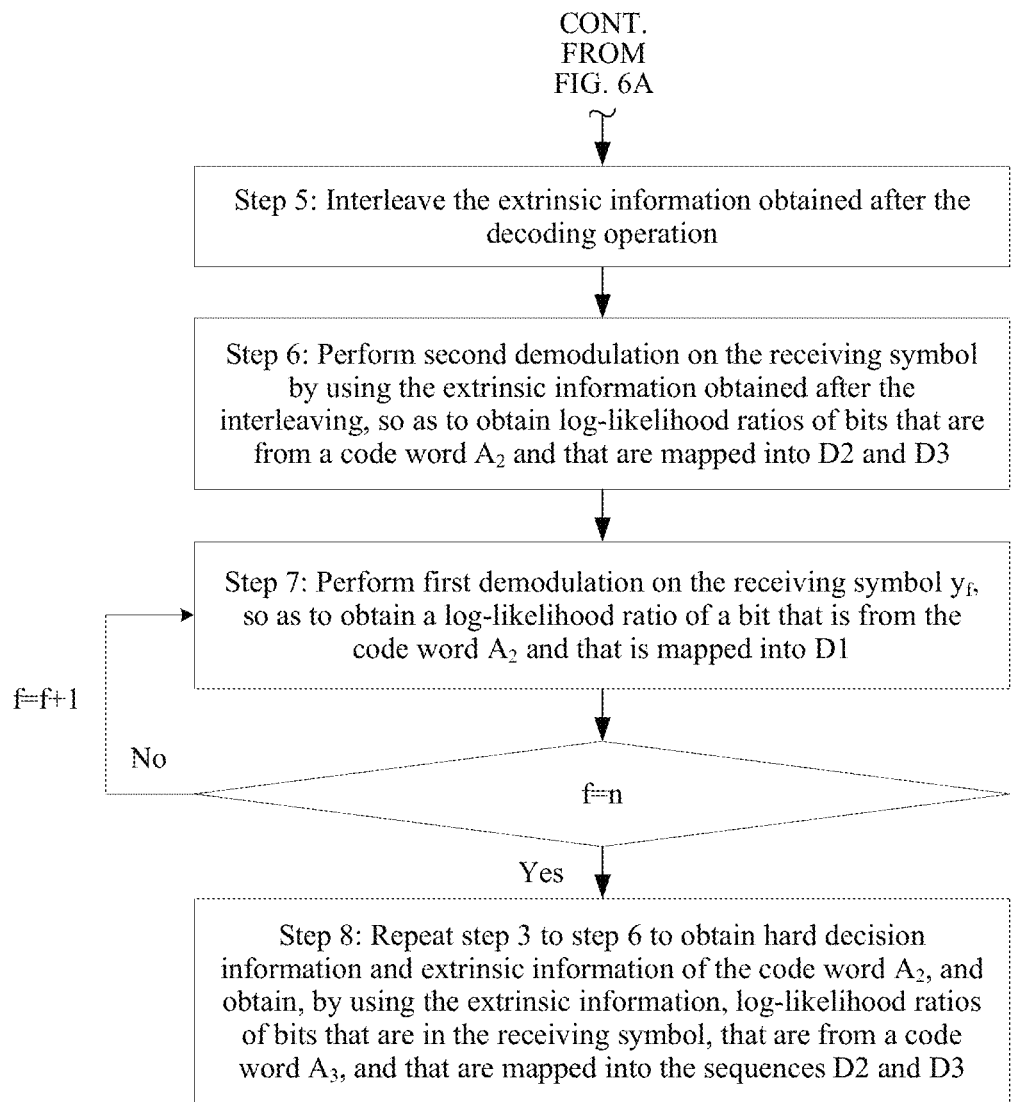

FIG. 6A and FIG. 6B are a processing flowchart of a receive end device according to an embodiment of this application. Specifically:

For f=1 to n/3, which is corresponding to FIG. 3A:

(1) A demodulation submodule 5011 performs first demodulation on the receiving symbol $y_f$ to obtain log-likelihood ratios of bits that are from a code word $A_1$ and that are mapped into sequences D2 and D3, and the log-likelihood ratios of the bits are cached until a remaining bit of the code word $A_1$ is demodulated.

For f=1+3/n to 2*n/3:

(2) The demodulation submodule 5011 performs first demodulation on the receiving symbol $y_f$ to obtain a log-likelihood ratio of a bit that is from the code word $A_1$ and that is mapped into a sequence D1, and the cache 5012 caches information about the symbol $y_f$. So far, all bits of the code word $A_1$ are demodulated.

(3) After a parallel-to-serial converter 503 performs parallel-to-serial conversion on the log-likelihood ratios of the bits obtained after demodulation to obtain one piece of information, a de-interleaver 504 performs de-interleaving on the information. A de-interleaving rule is a reverse process of interleaving performed by a transmit end.

(4) De-interleaved log-likelihood ratios of the bits are sent to a decoder 502 for decoding, so as to obtain hard decision information and extrinsic information. The hard decision information is final information obtained by the receive end by means of decoding.

(5) An interleaver 505 re-interleaves the extrinsic information obtained by means of decoding, and an interleaving process is the same as the interleaving process on the transmit end.

(6) A demodulation submodule 5013 performs, by using the extrinsic information obtained in step (4), second demodulation on bits that are in $y_f$ (f=3/n to 2*n/3) and that are from a code word $A_2$, so as to obtain log-likelihood ratios of bits that are from the code word $A_2$ and that are mapped into sequences D2 and D3, and the log-likelihood ratios of the bits are cached until a remaining bit of the code word $A_2$ is demodulated.

For f=1+2*n/3 to n:

(7) The demodulation submodule 5011 performs first demodulation on the receiving symbol $y_f$ to obtain a log-likelihood ratio of a bit that is from the code word $A_2$ and that is mapped into the sequence D1, and the cache 5012 caches information about the symbol $y_f$. So far, all bits of the code word $A_2$ are demodulated.

(8) Step (3) to step (6) are performed to obtain hard decision information and extrinsic information of the code word $A_2$, and the extrinsic information is used to obtain log-likelihood ratios of bits that are in the receiving symbol $y_f$ (f=2*n/3 to n), that are from a code word $A_3$, and that are mapped into the sequences D2 and D3.

When f is another value, step (7) and step (8) are repeated to demodulate and decode a receiving symbol.

The following describes the first demodulation performed by the demodulation submodule 5011.

Euclidean distances between the receiving symbol and each constellation point are calculated. An LLR of a bit $d_1$ is a value obtained by subtracting a sum of Euclidean distances between the symbol and constellation points when $d_1=0$ from a sum of Euclidean distances between the symbol and constellation points when $d_1=1$. This may be further simplified as follows: The LLR of the bit $d_1$ is a value obtained by subtracting a minimum value in the Euclidean distances between the symbol and the constellation points when $d_1=0$ from a minimum value in the Euclidean distances between the symbol and the constellation points when $d_1=1$.

Specifically, formulas (1) to (4) may be used for description.

A symbol probability that a sending symbol $s_i$ obtained based on a receiving symbol is $s^j$ is:

$$p(s_i = s^j \mid y_i) = \frac{1}{\sqrt{2\pi\sigma^2}} \exp\left(-\frac{\mid y_i - s^i \mid^2}{2\sigma^2}\right) \quad (1)$$

where, $y_i$ is a symbol received by a receiving system at a moment i, and $s_i$ is a symbol that is sent by a transmit end and that is corresponding to $y_i$.

$p(s_i = s^j \mid y_i)$ represents a probability that when the receiving symbol $y_i$ is known, the symbol $s_1$ sent by the transmit end is $s^j$. $\sigma$ is a standard deviation of a Gaussian channel, and exp is an index operation.

A log-likelihood ratio of each bit is:

$$LLR(d_k) = \quad (2)$$

$$\ln\left(\frac{p(d_k = 0 \mid y_i)}{p(d_k = 1 \mid y_i)}\right) = \ln\left(\frac{\sum_{j=1}^{M} I(d_k = 0 \mid s^j) \exp\left(-\frac{\mid y_i - s^j \mid^2}{2\sigma^2}\right)}{\sum_{j=1}^{M} I(d_k = 1 \mid s^j) \exp\left(-\frac{\mid y_i - s^j \mid^2}{2\sigma^2}\right)}\right)$$

$$I(d_k = a \mid s^j) = \quad (3)$$

$$\begin{cases} 1 & \text{A } k^{th} \text{ bit } d_k \text{ corresponding to a symbol } s^j \text{ is equal to } a \\ 0 & \text{A } k^{th} \text{ bit } d_k \text{ corresponding to a symbol } s^j \text{ is not equal to } a \end{cases}$$

where, $y_i$ is a symbol received by a receiving system at a moment i, and $s_i$ is a symbol that is sent by a transmit end and that is corresponding to $y_i$. $LLR(d_k)$ is a log-likelihood ratio of a $k^{th}$ bit, and ln is a natural logarithm.

$p(d_k=0 \mid y_i)$ represents a probability that when the receiving symbol $y_i$ is known, the $k^{th}$ bit of the symbol $s_1$ sent by the transmit end is 0. $p(d_k=1 \mid y_i)$ represents a probability that when the receiving symbol $y_i$ is known, the $k^{th}$ bit of the symbol $s_i$ sent by the transmit end is 1. $\sigma$ is a standard deviation of a Gaussian channel, and exp represents an index operation.

In an actual application, only maximum values in sum terms may be obtained, and in this case, the log-likelihood ratio of each code word bit may be simplified as follows:

$$LLR(d_k) \approx \ln \left( \frac{\max_{j=1,2,\ldots,M} \left\{ I(d_k = 0 | s^j) \exp\left(-\frac{|y_i - s^j|^2}{2\sigma^2}\right) \right\}}{\max_{j=1,2,\ldots,M} \left\{ I(d_k = 1 | s^j) \exp\left(-\frac{|y_i - s^j|^2}{2\sigma^2}\right) \right\}} \right) \quad (4)$$

where, $y_i$ is a symbol received by a receiving system at a moment i, and $s_i$ is a symbol that is sent by a transmit end and that is corresponding to $y_i$. $LLR(d_k)$ is a log-likelihood ratio of a $k^{th}$ bit, and ln is a natural logarithm.

$p(d_k=0|y_i)$ represents a probability that when the receiving symbol $y_i$ is known, the $k^{th}$ bit of the symbol $s_i$ sent by the transmit end is 0. $p(d_k=1|y_i)$ represents a probability that when the receiving symbol $y_i$ is known, the $k^{th}$ bit of the symbol $s_i$ sent by the transmit end is 1. $\sigma$ is a standard deviation of a Gaussian channel, and exp represents an index operation.

The following describes the second demodulation performed by the demodulation submodule 5013.

(1) Euclidean distances between the receiving symbol and each constellation point are calculated. Euclidean distances between the receiving symbol and constellation points when d=0 are updated to original Euclidean distances superposed with the extrinsic information output by the decoder. Euclidean distances between the receiving symbol and constellation points when $d_1=1$ remain unchanged.

(2) An LLR of a bit $d_k$ is a value obtained by subtracting a sum of Euclidean distances between the symbol and constellation points when $d_k=0$ from a sum of Euclidean distances between the symbol and constellation points when $d_k=1$. This may be further simplified as follows: The LLR of the bit $d_k$ is a value obtained by subtracting a minimum value in the Euclidean distances between the symbol and the constellation points when $d_k=0$ from a minimum value in the Euclidean distances between the symbol and the constellation points when $d_k=1$.

Specifically, a formula (5) may be used.

A calculation manner of a symbol probability of the symbol when $d_1=0$ is updated to:

$$p(s = s^j | y_i) = \frac{1}{\sqrt{2\pi\sigma^2}} \exp\left(-\frac{|y_i - s^j|^2}{2\sigma^2}\right) \times \exp^{Ex(d_{0,i-1})} = \frac{1}{\sqrt{2\pi\sigma^2}} \exp\left(-\frac{|y_i - s^j|^2}{2\sigma^2} + Ex(d_{0,i-1})\right) \quad (5)$$

A calculation manner of a symbol probability of the symbol when $d_1=1$ is still the formula (1).

Then, log-likelihood ratios of each $d_2, d_3$ are calculated based on the first demodulation (refer to formulas (2), (3), and (4)), where $y_i$ is a symbol received by a receiving system at a moment i, and $s_i$ is a symbol that is sent by a transmit end and that is corresponding to $y_i$. $p(s_i=s^j|y_i)$ represents a probability that when the receiving symbol $y_i$ is known, the symbol $s_i$ sent by the transmit end is $s^j$. $\sigma$ is a standard deviation of a Gaussian channel, and exp represents an index operation.

In an embodiment, a value of the extrinsic information mentioned above may be obtained in three manners, respectively:

(1) The extrinsic information is information obtained after prior information input to the decoder is subtracted from posterior information obtained by the decoder.

(2) The extrinsic information is posterior information obtained by the decoder.

(3) A symbol in the value of (1) or (2) remains unchanged. If decoding is correct, the value is set to infinity; or, if decoding is incorrect, the value is set to 0.

Persons skilled in the art should understand that the embodiments of this application may be provided as a method, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing apparatus to generate a machine, so that the instructions executed by a computer or a processor of any other programmable data processing apparatus generate an apparatus for implementing a specific function in one or more processes in the flowcharts and/or in one or more blocks in the block diagrams.

These computer program instructions may be stored in a computer readable memory that can instruct the computer or any other programmable data processing apparatus to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing apparatus, so that a series of operations and steps are performed on the computer or the another programmable apparatus, thereby generating computer-implemented processing. Therefore, the instructions executed on the computer or the another programmable apparatus provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to this application without departing from the scope of this application.

What is claimed is:

1. A modulation method, comprising:
receiving, by a transmitter device in a communication system, a code word sequence, wherein the code word sequence comprises a first code word and a second code word;
mapping, by the transmitter device, the code word sequence into M sequences, wherein each sequence of the M sequences comprises bits from the first code word and bits from the second code word;
mapping, by the transmitter device, the M sequences into a symbol sequence, wherein each symbol in the symbol sequence corresponds to M bits, the M bits are from the M sequences, wherein the symbol sequence comprises a first symbol, and the M bits corresponding to the first symbol comprise at least one bit from the first code word, and at least one bit from the second code word; and
transmitting, by the transmitter device, the symbol sequence to a receiver device in the communication system.

2. The method according to claim 1, wherein the first code word and the second code word are coded by using a same coding rule.

3. The method according to claim 1, wherein each code word in the code word sequence comprises N bits, and each sequence of the M sequences comprises N/M bits from the first code word and N/M bits from the second code word, wherein N is an integral multiple of M.

4. The method according to claim 3, wherein a number of instances of the first symbol in the symbol sequence is N/M.

5. The method according to claim 1, wherein each symbol in the symbol sequence corresponds to one constellation point in $_2M$ constellation points in a 2m constellation diagram, a minimum Euclidean distance between the constellation points in the $2^{11}$ constellation diagram is a first Euclidean distance, a minimum Euclidean distance between constellation points that are in the $_2M$ constellation diagram and that correspond to the first-type symbols after bits from the first code word are determined is a second Euclidean distance, and the second Euclidean distance is greater than the first Euclidean distance.

6. The method according to claim 3, wherein the mapping the code word sequence into M sequences comprises:
performing serial-to-parallel conversion on the code word sequence to obtain the M sequences; and
performing delay processing on at least one sequence in the M sequences, wherein a quantity of delayed bits is X*(N/M), and X is an integer greater than or equal to 1.

7. The method according to claim 1, wherein the mapping the code word sequence into M sequences comprises:
interleaving the code word sequence to obtain the M sequences.

8. The method according to claim 3, wherein M is 3, and the mapping the code word sequence into M sequences comprises:
performing serial-to-parallel conversion on the code word sequence to obtain three sequences, wherein each sequence comprises N/3 bits from the first code word; and
performing delay processing on a first sequence of the M sequences, wherein a quantity of delayed bits is N/3.

9. A receiving method, comprising:
receiving, by a receiver device from a transmitter device in a communications system, a symbol sequence transmitted using a channel, wherein the symbol sequence includes a first code word and a second code word;
demodulating, by the receiver device, symbols comprising at least one bit from the first code word to obtain a log-likelihood ratio of bits from the first code word;
performing, by the receiver device, decoding based on log-likelihood ratios of the bits from the first code word to obtain first extrinsic information; and
demodulating, by the receiver device, the first symbol using the first extrinsic information to obtain a log-likelihood ratio of a bit from another code word, wherein bits corresponding to the first symbol comprise at least one bit from the first code word, and at least one bit from the second code word.

10. The method according to claim 9, wherein the first extrinsic information is information obtained after prior information of the decoding is subtracted from later information that is obtained after the decoding.

11. A modulation apparatus, comprising:
a memory storing instructions; and
a processor configured to execute the instructions to cause the modulation apparatus to:
receive a code word sequence, wherein the code word sequence comprises a first code word and a second code word;
map the code word sequence into M sequences, wherein each sequence of the M sequences comprises bits from the first code word and bits from the second code word; and
map the M sequences into a symbol sequence, wherein each symbol in the symbol sequence corresponds to M bits, the M bits are from the M sequences, wherein the symbol sequence comprises a first symbol, and the M bits corresponding to the first symbol comprise at least one bit from the first code word, and at least one bit from the second code word.

12. The apparatus according to claim 11, wherein the first code word and the second code word are coded by using a same coding rule.

13. The apparatus according to claim 11, wherein each code word in the code word sequence comprises N bits, and each sequence of the M sequences comprises N/M bits from the first code word and N/M bits from the second code word, wherein N is an integral multiple of M.

14. The apparatus according to claim 13, wherein a number of instances of the first symbol in the symbol sequence is N/M.

15. The apparatus according to claim 11, wherein each symbol in the symbol sequence corresponds to one constellation point in $_2m$ constellation points in a $2^{11}$ constellation diagram, a minimum Euclidean distance between the constellation points in the $_2m$ constellation diagram is a first Euclidean distance, a minimum Euclidean distance between constellation points that are in the $_2{}^{11}$ constellation diagram and that corresponds to the first-type symbols after bits from the first code word are determined is a second Euclidean distance, and the second Euclidean distance is greater than the first Euclidean distance.

16. The apparatus according to claim 13, wherein executing the instructions further causes the modulation apparatus to:
perform serial-to-parallel conversion on the code word sequence to obtain M sequences; and
perform delay processing on at least one sequence in the M sequences, wherein a quantity of delayed bits is $X*(N/M)$, and X is an integer greater than or equal to 1.

17. The apparatus according to claim 11, wherein executing the instructions further causes the modulation apparatus to:
interleave the code word sequence to obtain M sequences.

18. The apparatus according to claim 13, wherein M is 3, and wherein executing the instructions further causes the modulation apparatus to:
perform serial-to-parallel conversion on the code word sequence to obtain three sequences, wherein each sequence comprises N/3 bits from the first code word; and
perform delay processing on a first sequence of the M sequences, wherein a quantity of delayed bits is N/3.

19. A receiving apparatus, comprising:
a memory storing instructions; and
a processor configured to execute the instructions to cause the modulation apparatus to:
receive a symbol sequence transmitted using a channel, wherein the symbol sequence includes a first code word and a second code word;
demodulate symbols comprising at least one bit from the first code word to obtain a log-likelihood ratio of bits from the first code word;
perform decoding based on log-likelihood ratios of the bits from the first code word to obtain first extrinsic information;
demodulate the first symbol using the first extrinsic information to obtain a log-likelihood ratio of a bit from another code word, wherein bits corresponding to the first symbol comprise at least one bit from the first code word, and at least one bit from the second code word.

20. The apparatus according to claim 19, wherein the first extrinsic information is information obtained after prior information of the decoding is subtracted from later information that is obtained after the decoding.

21. The method according to claim 3, wherein M is 3, and the mapping the code word sequence into M sequences comprises:
performing serial-to-parallel conversion on the code word sequence to obtain three sequences, wherein each sequence comprises N/3 bits from the first code word;
performing delay processing on a first sequence of the M sequences, wherein a quantity of delayed bits is N/3; and
performing delay processing on a second sequence of the M sequences, wherein a quantity of delayed bits is N/3.

22. The method according to claim 3, wherein M is 3, and the mapping the code word sequence into M sequences comprises:
performing serial-to-parallel conversion on the code word sequence to obtain three sequences, wherein each sequence comprises N/3 bits from the first code word;
performing delay processing on a first sequence of the M sequences, wherein a quantity of delayed bits is 2(N/3); and
performing delay processing on a second sequence of the M sequences, wherein a quantity of delayed bits is N/3.

23. The apparatus according to claim 13, wherein M is 3, and wherein executing the instructions further causes the modulation apparatus to:
perform serial-to-parallel conversion on the code word sequence to obtain three sequences, wherein each sequence of the M sequences comprises N/3 bits from the first code word;
perform delay processing on a first sequence of the M sequences, wherein a quantity of delayed bits is N/3; and
perform delay processing on a second sequence of the M sequences, wherein a quantity of delayed bits is N/3.

24. The apparatus according to claim 13, wherein M is 3, and wherein executing the instructions further causes the modulation apparatus to:
perform serial-to-parallel conversion on the code word sequence to obtain three sequences, wherein each sequence of the M sequences comprises N/3 bits from the first code word;
perform delay processing on a first sequence of the M sequences, wherein a quantity of delayed bits is 2(N/3); and
perform delay processing on a second sequence of the M sequences, wherein a quantity of delayed bits is N/3.

* * * * *

UNITED STATES PATENT AND TRADEMARK OFFICE
CERTIFICATE OF CORRECTION

PATENT NO. : 11,283,545 B2
APPLICATION NO. : 16/887915
DATED : March 22, 2022
INVENTOR(S) : Yan et al.

It is certified that error appears in the above-identified patent and that said Letters Patent is hereby corrected as shown below:

In the Claims

Claim 5, Column 23, Line 38: "point in $_2$M constellation points in a 2m constellation" should read -- point in $2^M$ constellation points in a $2^M$ constellation --.

Claim 5, Column 23, Line 40: "stellation points in the $2^{11}$ constellation diagram is a first" should read -- stellation points in the $2^M$ constellation diagram is a first --.

Claim 5, Column 23, Lines 42-43: "constellation points that are in the $_2$M constellation diagram and that correspond to the first-type symbols after bits from" should read -- constellation points that are in the $2^M$ constellation diagram and that correspond to first-type symbols after bits from --.

Claim 15, Column 24, Line 59: "lation point in $_2$m constellation points in a $2^{11}$ constellation" should read -- lation point in $2^M$ constellation points in a $2^M$ constellation --.

Claim 15, Column 24, Line 61: "stellation points in the $_2$m constellation diagram is a first" should read -- stellation points in the $2^M$ constellation diagram is a first --.

Claim 15, Column 24, Lines 63-64: "constellation points that are in the $_2^{11}$ constellation diagram and that corresponds to the first-type symbols after bits from" should read -- constellation points that are in the $2^M$ constellation diagram and that corresponds to first-type symbols after bits from --.

Signed and Sealed this
Twenty-sixth Day of July, 2022

Katherine Kelly Vidal
*Director of the United States Patent and Trademark Office*